US008736106B2

(12) United States Patent
Byrne et al.

(10) Patent No.: US 8,736,106 B2
(45) Date of Patent: May 27, 2014

(54) INTERNATIONAL OUTLET SYSTEM

(76) Inventors: Norman R. Byrne, Ada, MI (US); Randell E. Pate, Jenison, MI (US); Timothy J. Warwick, Sparta, MI (US)

( * ) Notice: Subject to any disclaimer, the term of this patent is extended or adjusted under 35 U.S.C. 154(b) by 0 days.

(21) Appl. No.: 13/498,509

(22) PCT Filed: Sep. 7, 2010

(86) PCT No.: PCT/US2010/047981

§ 371 (c)(1),
(2), (4) Date: Mar. 27, 2012

(87) PCT Pub. No.: WO2011/041070

PCT Pub. Date: Apr. 7, 2011

(65) Prior Publication Data

US 2012/0184148 A1 Jul. 19, 2012

Related U.S. Application Data

(60) Provisional application No. 61/247,126, filed on Sep. 30, 2009.

(51) Int. Cl.
*H05K 1/02* (2006.01)

(52) U.S. Cl.
USPC ............... 307/42; 439/215; 439/650; 174/50; 174/53; 174/57; 174/58; 174/59

(58) Field of Classification Search
USPC .................. 439/215, 650; 174/50, 53, 57–59; 307/42
See application file for complete search history.

(56) References Cited

U.S. PATENT DOCUMENTS

| | | | | |
|---|---|---|---|---|
| 1,187,010 | A | 6/1916 | Rodrigues | |
| 2,540,575 | A | 2/1951 | Finizie | |
| 4,135,775 | A | 1/1979 | Driscoll | |
| 4,382,648 | A | 5/1983 | Propst et al. | |
| 4,551,577 | A | 11/1985 | Byrne | |
| 4,959,021 | A | 9/1990 | Byrne | |
| 5,013,252 | A | 5/1991 | Nienhuis et al. | |
| 5,073,120 | A | 12/1991 | Lincoln et al. | |
| 5,096,431 | A | 3/1992 | Byrne | |
| 5,096,434 | A | 3/1992 | Byrne | |
| 5,164,544 | A | 11/1992 | Snodgrass et al. | |
| 5,178,555 | A | 1/1993 | Kilpatrick et al. | |
| 5,259,787 | A | 11/1993 | Byrne | |
| 6,220,880 | B1 * | 4/2001 | Lee et al. | 439/214 |
| 7,255,596 | B2 * | 8/2007 | Pyrros | 439/535 |
| 7,410,379 | B1 * | 8/2008 | Byrne | 439/215 |
| 8,610,402 | B2 * | 12/2013 | Giribet Guadamillas | 320/114 |
| 2003/0159850 | A1 | 8/2003 | McCarthy | |

(Continued)

OTHER PUBLICATIONS

International Preliminary Report on Patentability International Application No. PCT/US2010/047981, dated Apr. 3, 2012.

(Continued)

*Primary Examiner* — Jared Fureman
*Assistant Examiner* — Alfonso Perez Borroto
(74) *Attorney, Agent, or Firm* — Gardner, Linn, Burkhart & Flory, LLP

(57) ABSTRACT

A mechanical outlet system is connected to an incoming power source through power entry cables. The cables connect to cable connectors which, in turn, connect to junction blocks. The junction blocks receive outlet receptacle blocks. The receptacle blocks can be of varying types of sockets, without requiring electrical modifications to the junction blocks.

33 Claims, 55 Drawing Sheets

(56) References Cited

U.S. PATENT DOCUMENTS

| | | | |
|---|---|---|---|
| 2003/0176100 | A1 | 9/2003 | Yurek et al. |
| 2008/0280475 | A1 | 11/2008 | Byrne |
| 2009/0008120 | A1 | 1/2009 | Gates et al. |
| 2011/0003505 | A1 | 1/2011 | Greig et al. |
| 2011/0021050 | A1 | 1/2011 | Byrne |

OTHER PUBLICATIONS

International Search Report of the International Searching Authority from corresponding Patent Cooperation Treaty (PCT) Application No. PCT/US2010/047981, mailed Nov. 16, 2010.

* cited by examiner

INTERNATIONAL OUTLET SYSTEM

CROSS-REFERENCE TO RELATED APPLICATIONS

This application claims priority and is based upon U.S. Provisional Patent Application Ser. No. 61/247,126, filed Sep. 30, 2009.

STATEMENT REGARDING FEDERALLY SPONSORED RESEARCH OR DEVELOPMENT

Not applicable.

REFERENCE TO MICROFISHE APPENDIX

Not applicable.

BACKGROUND OF THE INVENTION

1. Field of the Invention

The invention relates to electrical power distribution systems and, more particularly, to systems employing modular components with the capability of utilizing junction blocks for providing various types of circuit configurations, and electrically interconnecting outlet receptacle blocks so as to provide for interconnecting various types of international outlet receptacles.

2. Background Art

It is known to utilize power distribution systems with various types of physical structures, including modular distribution systems for use with wall panels, work surfaces and the like. Such distribution systems can include what are often characterized as raceway systems, although actual "raceways" may not be utilized. The raceway distribution systems can include a series of cables and junction blocks, with the junction blocks having the capability of selectively being interconnected to one or more electrical outlet receptacles mounted in the junction blocks. Incoming power is supplied to the junction blocks (and to the interconnected outlet receptacles) through power cables which may be "hard-wired" to the junction blocks, or otherwise releasably connectible to the junction blocks.

The receptacles may be positioned on one or on two opposing sides of the junction blocks. Further, the outlet receptacles may be in the form of single or "simplex" outlet receptacles. Alternatively, it is known to "bundle" outlet receptacles in "receptacle blocks." A receptacle block may include two (i.e., duplex), three (i.e. triplex), or more receptacles.

Still further, the junction blocks and the receptacles may be formed as a single unit which are manufactured together or otherwise or assembled together at the factory. Such configurations are typically characterized as being "integral" units, or junction blocks and outlet receptacles which are "hard-wired" together. Alternatively, the receptacles (or receptacle blocks) may be releasably, mechanically and electrically coupled together "on-site" (i.e., where the distribution system is actually being installed and will be in use).

Various problematic issues exist with respect to usage of power distribution systems with electrical receptacles. During the past two decades, a substantial amount of research and development have been directed to raceways, junction blocks and receptacles, means for interconnection of the junction blocks and receptacles, and mounting of the junction blocks within the raceways. One aspect of the increasing use of electrical power relates to circuit loads. Any particular electrical circuit is limited to carrying a finite power load. Previously, when electrical power was not used to the extent that it is today, a single electrical circuit interconnecting to an incoming power supply was typically sufficient to handle power requirements. Accordingly, wiring within stationery or movable walls (or other wiring configurations) could comprise only two (hot and neutral) or three (hot, neutral and ground) wires, with receptacle blocks having simplex or duplex receptacles typically wired directly to the incoming two or three-wire circuit. However, today, it is advantageous to employ systems having an incoming power supply comprising multiple electrical circuits. The development of modular systems has advantageously provided for facilitating various circuit configurations and reconfigurations at locations of use.

For example, power distribution system design often requires a reasonable balancing of loads among incoming circuits. However, having the ability of multiple circuits has led to other electrical wiring issues. For example, a number of junction blocks and outlet receptacle blocks may be assembled within several raceways of a modular system, with wiring and bus bars configured for interconnection of the outlet receptacles for a particular one of the available multiple circuits. However, over time, electrical power loads may change, resulting in load balance problems and the like. These changes may require circuit reconfigurations involving substantial rewiring and "change out" of junction blocks, receptacles and other electrical components to other devices having different wire and bus bar configurations, so as to accommodate circuit changeovers. In the past, many junction block and receptacle designs could handle only a single incoming power circuit (and pass-through of the incoming circuit "down the line"). To connect junction blocks and receptacles to differing circuits, differently wired junction blocks and differently wired receptacles were required to be used.

Today, however, junction blocks are commercially available which provide for the capability of receiving (and passing through) incoming power from multiple circuits. Still, however, even with multiple incoming circuits to the junction blocks, differing outlet receptacle modules have been required to provide electrical connections to different ones of the separate circuits. A disadvantage of this arrangement has been that a separate supply receptacle module must be kept, and a receptacle module of proper type must be found each time a change is to be made to a different circuit arrangement. This presented substantial inconveniences to the user and required substantial and separate stocking of parts.

A substantial advance was made with respect to receptacle blocks having multiple outlet receptacles and capable of being arranged for use with multiple circuit configurations in commonly owned Byrne U.S. Pat. No. 7,410,379, issued Aug. 12, 2008. In the Byrne patent, outlet receptacle blocks were provided having circuit means for electrically and selectively coupling the receptacle blocks to power supply means through the junction blocks, in a series of special orientations. In this manner, any one of a plurality of power supply circuits could be coupled to the receptacle blocks.

In addition to the issues associated with multiple circuit configurations, existing issues also exist with respect to the capability of power distribution design and modularity regarding different "types" of receptacles, with respect to power, data and other energy connectors. That is, junction blocks are wired so as to be physically and electrically connectible to a particular "type" of receptacle block, at least with respect to physical structure and wiring. Correspondingly, the junction blocks and the internal wiring of receptacle blocks are configured so as to be electrically connected to only a single type of outlet receptacle configuration. In the past, this limitation with respect to the usage of particular outlet receptacles has not present significant problems, in that power distribution systems have been typically designed for use in one particular country. For example, in the U.S., the vast majority of power distribution systems and electrical appliances use a very limited number of electrical outlet receptacle types.

However, with the global economy and commerce, power distribution systems are being marketed and used in a variety of developed and developing countries. However, with known systems, differently wired power distribution systems (with respect to junction blocks and other modular electrical components) must be wired differently and configured differently, depending upon the electrical requirements of the particular county in which the systems will be used. The various countries have a substantial number of different types of wiring and outlet receptacle requirements. Accordingly, it would be advantageous if a system could be developed which could accommodate different users in different countries, while still retaining modularity and a limited number of electrical components being required to have differing wiring configurations.

The following paragraphs briefly describe certain known systems utilizing various types of modular electrical components, both within wall panels, various raceway configurations, and other system designs.

One example of a prior art system is illustrated in Propst, et al., U.S. Pat. No. 4,382,648 issued May 10, 1983. In the Propst, et al. system, mating connectors of opposing panels are engaged when the panels are aligned in a straight line. When the panels are positioned in an intersecting relationship, specially manufactured couplers are utilized. One type of special coupler is used when the panels are positioned at right angles. Another type is used with adjoining panels arranged at angles other than right angles. Consequently, costly inventory of couplers must be maintained. The Propst, et al. system uses a double set of connectors comprising a male and female connector for each conductor to be interconnected. When a single one of these prior art panels intersects two adjacent panels, one of the specially manufactured couplers connects the female terminals to one of the adjacent panels, and another of the couplers connects the male terminals to the adjacent panel.

A further system is disclosed in Driscoll, U.S. Pat. No. 4,135,775, issued Jan. 23, 1979. In the Driscoll system, each panel is provided with an electrical outlet box in its raceway. Panels of different widths are provided with a pair of female connectors. Outlet boxes of adjacent panels are interconnected by means of flexible cables having male connectors at both ends. When three or four panels are adjoined in an intersecting arrangement, two cables may be connected the pair of female connectors at one end of an outlet box. In this manner, connection of two adjacent panels is facilitated.

With respect to both of the foregoing systems, and other than in the special intersecting relationship, one half of the double set of terminals of these systems is superfluous. There is a distinct disadvantage in modern day systems, where several independent electrical circuits are needed in a wall panel system, with each requiring separate connectors. Space for such circuits and their connectors is very limited in the raceway areas of modern, thin-line wall panels.

Other systems also exist with respect to electrical connectors, junction boxes, and the like. For example, Rodrigues, U.S. Pat. No. 1,187,010 issued Jun. 13, 1916, discloses a detachable and interchangeable electrical switch plug adapted for use in connection with various electrically heated appliances. A clamping device is positioned in a fixed, but detachable relationship to one end of the plug. Means are provided to enclose and prevent sharp flexure of the cord comprising a flexible enclosing tube gripped under tension by the other end of the clamping device. The plug and the clamping device may be simultaneously removed from the socket.

Finizie, U.S. Pat. No. 2,540,575, issued Feb. 6, 1951, discloses a cord guide member for utensil plugs. The concept is to reduce wear on the cord and the connector plug, and to provide a connection which will withstand heavy pulling strains without injury. Strain relief is also provided. A sectional body is equipped anteriorally adjacent one end of the body with terminals. The other end of the body contains an anterior chamber or socket. A pivotable cord-guiding member having a pivot member is movably mounted in the socket. A wedge-shaped strain relief insert is received within a wedge-shaped recess in the pivot member. A cord extends into the pivot member and includes wires passing from the cord toward the terminals. The incoming portions of the wires are moved around the insert and firmly wedged within the recess.

Byrne, U.S. Pat. No. 4,551,577, issued Nov. 5, 1985, describes a retractable power center. The power center provides for conveniently located electrical power source receptacles adapted to be mounted on a work surface. In one embodiment, the power center includes a rectangular housing received within a slot in a work surface. A clamping arrangement is utilized to secure the housing to the work surface. A lower extrusion is connected to the lower portion of the housing. A movable power carriage mounts the receptacles and a catch assembly releasably maintains a carriage in a closed and retracted position. In response to manual activation, the catch assembly is released and springs tensioned between the carriage and the extrusion exert forces so as to extend the carriage upward into an extended, open position. In the open position, the user can energize the desired electrical devices from the receptacles, and then lower the carriage into the retracted position.

Byrne, U.S. Pat. No. 4,959,021, issued Sep. 25, 1990, discloses a pivotable power feed connector having a pivotal connector adapted to be connected to a flexible conduit or cable. The cable has a series of conductors extending there through. The connector is pivotably connected to a block assembly through which the conductors extend. The block assembly, in turn, is connectable to a contact block, with the conductors conductively connected to a set of prong terminals extending outwardly from the block. A cover is secured over the block so as to prevent the prong terminals from being exposed during assembly and disassembly.

The cover automatically exposes the prong terminals as the power feed connector is moved into engagement with a receptacle in a modular office panel. The connector allows the conduit or cable to be swiveled to an arc of approximately 180 degrees to any desired position. The connector is also manually removable from interconnection with the block assembly. Such removal allows the conduit or cable to be pulled back from the conductors and cut to a desired length. The connector includes a power feed cover which can be utilized in part to maintain the connector in either of two spatial configurations relative to the block assembly.

Nienhuis, et al., U.S. Pat. No. 5,013,252, issued May 7, 1991, discloses an electrified wall panel system having a power distribution server located within a wall panel unit. The server includes four receptacle module ports oriented in an h-shaped configuration. A first receptacle port is located on the first side of the wall panel unit and opens toward a first end of the unit. A second receptacle unit is also located on the first side of the wall panel unit, and opens toward a second end of the wall panel unit. A third receptacle port and a second sided wall panel unit opens toward the first end of the wall panel unit, while correspondingly, a fourth receptacle port on the second side of the wall panel unit opens toward the second end of the wall panel unit. First and second harnesses are each electrically connected at first ends thereof to the power distribution server. They extend to opposite ends of the wall paneled unit and include connector ports on the second ends thereof for providing electrical interconnection of adjacent wall panel units. The Nienhuis, et al. patent also discloses a system with a wall panel connector interchangeably usable with the interconnection of two, three or four units. The connector includes a hook member for connecting together adjacent vertical members of frames of adjacent wall panel units at a lower portion thereof. A draw naught for connecting together adjacent vertical members of frames of adjacent wall panel units and an odd proportion thereof is provided by vertical displacement thereof.

Lincoln, et al. U.S. Pat. No. 5,073,120, issued Dec. 17, 1991, discloses a power distribution assembly having a bussing distribution connector. The connector includes a series of bus terminals positioned within an electrically insulative housing. A series of electrical terminals are positioned in the housing for distributing more than one electrical circuit. At least one ground terminal, one neutral terminal, and three hot terminals are provided. A grounding shell partially surrounds the bus connector and includes a grounding tab grounding the one ground terminal to the metallic grounding shell. In another embodiment, two bus connectors are interconnected together, so as to provide for an increased number of output ports.

Byrne, U.S. Pat. No. 5,096,431, issued Mar. 17, 1992, discloses an outlet receptacle with rearrangeable terminals. The receptacle is provided with input terminals to selected positions, for engagement with terminals of an electrical junction block. The block includes a series of terminals representing a plurality of different electrical circuits. The receptacle block has neutral, ground and positive flexible positive conductor bars electrically connected to neutral, ground and positive electrical terminals. Input terminals of the block are formed integral with the flexible conductor bars and levers are provided for moving the terminal ends of the conductor bars to physically different positions. In one configuration, the receptacle block housing is provided with openings at opposing ends, and the flexible conductor bars have terminal ends controlled by levers at both ends of the outlet receptacle block. In another configuration, the block has output terminals in a front wall, and the input terminals of the receptacle block are formed as ends of the flexible bars and extend at an approximately 90 degree angle to the bars. They further send through openings in the back wall of the outlet receptacle for engagement with terminals of a junction block. Levers are provided in the back wall of the receptacle block for positioning the terminal ends in alignment with different terminals of the junction block, and windowed openings in the front wall expose indices on the levers identifying selected circuits.

Byrne, U.S. Pat. No. 5,096,434, issued Mar. 17, 1992, discloses an electrical interconnection assembly for use in wall panels of a space divider wall system. The system includes junction blocks having several receptacle connectors, so as to provide a plurality of electrical outlets on both sides of a wall panel. The junction block is connected by means of conduits extending from both ends of the junction block to oppositely directed connector blocks for connection to adjoining panels. The assembly of the junction block and connector blocks allows electrical power to be supplied to one end of the panel and conducted to and through the junction block to other panels. The receptacle connectors on the junction block each have one type of terminal configuration, e.g., a female electrical terminal configuration. One of the connector blocks is provided with the identical terminal configuration. The other connector block is provided with a matching terminal configuration, e.g., a male electrical terminal configuration. When two wall panels are joined at their respective edges, the male connector block may be readily connected to the female connector block in the adjacent panel. When two panels are joined to a third panel, all at one point, the arrangement of this invention allows the male connector block to be connected to the female connector block of one of the other two panels, and the male connector of the other of the two panels may be connected to one of the receptacle connectors of the junction block on either of the other two panels, in this manner establishing a three way interconnection arrangement. In a similar fashion, a fourth, or other additional panels may be added to the junction and plug into receptacle outlets of other panels in order to provide an arrangement of panels that is totally interconnected, electrically.

Snodgrass, et al., U.S. Pat. No. 5,164,544, issued Nov. 17, 1992, describes an electrified space dividing panel having a panel member, raceway, modular, or electric system disposed in a raceway and raceway covers for gaining access to the system. The system includes a single terminal block having end and side sockets, with first and second electrical receptacles being respectively removeably engaged with the end socket and the side sockets, such that the first and second electrical receptacles are disposed in horizontally spaced, side-by-side relation and project outwardly for predetermined light dimensions through receptacle openings in one of the raceway covers. The raceway can include a web having an opening which cooperates with a support ear on the first receptacle during engagement of the first receptacle with an end socket, so as to provide additional lateral support for the electrical receptacle when a plug is removed there from.

Kilpatrick, et al., U.S. Pat. No. 5,178,555, issued Jan. 12, 1993, discloses a kit which includes a junction box for installation along a raceway. The kit includes a mounting bracket having a first adjustable mounting mechanism for locating the bracket along the raceway. This provides an initial adjustment, and a second adjustable mounting mechanism is provided for securing the junction box to the mounting bracket. This adjustably locates the junction box along the mounting bracket, and provides a second or final adjustment to accurately locate the junction box between two pre-measured lengths of cable.

Byrne, U.S. Pat. No. 5,259,787, issued Nov. 9, 1993, discloses an electrical junction block mounting assembly, which may be utilized for mounting the junction block within a raceway. The assembly includes a cantilever beam formed on an outer wall of the junction block. This beam is provided with a transversely extending channel for engagement with a support structure. The beam is attached to the junction block by means of a resilient hinge section, and is provided with a first arm section extending between the hinge section and the channel, and a second arm section extending beyond the channel. The first arm section has a sloping surface sloping away from the outer channel between the hinge section of the panel. The second armed section has a sloping surface sloping toward the wall beyond the channel. The surfaces will contact a mounting rail or similar structure during installation of the junction block. In this manner, the hinged cantilever beam is deflected until the rail is in alignment with the channel for engagement with the structural support member.

SUMMARY OF THE INVENTION

In accordance with the invention, an international power distribution system is adapted for use to energize outlet receptacles of various types. The power distribution system includes an incoming power cable assembly connected to a source of incoming power. A series of junction block assemblies are also provided, with at least a first one of the assemblies being electrically coupled, directly or indirectly, to the source of incoming power. A series of cable assemblies are electrically and mechanically interconnected to at least a subset of the junction block assemblies. The junction block assemblies include receptacle receiving means capable of energizing, from the source of incoming power, a series of alternative, differing international outlet receptacles having various types of outlet sockets, without requiring any electrical or mechanical modifications to the junction block assemblies.

In one aspect, the outlet receptacles include a Type F outlet receptacle. In accordance with another aspect of the invention, the outlet receptacles comprise a Type I receptacle, having a ground pin and a pair of live pins forming a V-shape. Still further, the outlet receptacles can comprise a Type J receptacle. In addition, the outlet receptacles can include a Type B NEMA 5 receptacle. Still further, the outlet receptacles can comprise a Type B receptacle. In addition, the outlet receptacles can comprise a Type G or 13 amp receptacle.

In accordance with other aspects of the invention, the junction block assemblies can each comprise a junction block and a pair of junction block end connectors located at opposing ends of the junction block. The receptacle receiving means are located within the junction blocks. Each of the junction block assemblies can include at least one junction block. The receptacle receiving means can include, for each of the junction blocks, a pair of receiving sections located in a face of the junction block, for receiving a pair of the outlet receptacles. Each of the pair of the outlet receptacles can be of a different type and configuration from the other of the pair of outlet receptacles.

Still further, with each of the junction block assemblies comprising a junction block, the receptacle receiving means can comprise a set of three receiving sections for each of the junction blocks, located in a face of the junction block, for receiving three of the outlet receptacles. Each of the three outlet receptacles can be of a different type and configuration from the other two of the three outlet receptacles. In addition, each of the junction block assemblies can include a junction block, and the receptacle receiving means can comprise, for at least one of the junction blocks, a set of four receiving sections located in a face of the junction block. The receiving sections receive four of the outlet receptacles, with each of the outlet receptacles being of a differing type and configuration from the other three of the outlet receptacles.

At least a subset of the cable assemblies can comprise jumper cable assemblies, with each of the jumper cable assemblies having a cable connected at its ends to a pair of opposing end connectors. Still further, at least a subset of the outlet receptacles may be polarized. In addition, the incoming power cable assembly can correspond in structure and configuration at least a subset of the series of cable assemblies.

The power distribution system can include means for interconnecting a pair of cable assemblies, in an electrical and mechanical structure to one of the end connectors of one of the subsets of the junction block assemblies. Still further, the means for interconnecting a pair of cable assemblies can include a quad connector. Still further, the power distribution system can include means for coupling each of the junction blocks of the subset of the junction blocks to a vertically disposed wall element.

BRIEF DESCRIPTION OF THE DRAWINGS

The invention will now be described with reference to the drawings, in which:

FIG. 114 is a sectional view similar to FIG. 112, but showing the cable connector ends in a fully assembled position;

FIG. 115 is an exploded view of the portion of FIG. 114 identified by circle 115;

FIG. 116 is a sectional view similar to FIG. 112;

FIG. 117 is an enlarged view showing the portion of FIG. 116 identified by circle 117;

FIG. 118 is a sectional view similar to FIG. 116, but showing the cable connector ends as being partially assembled together;

FIG. 119 is an enlarged view of the portion of FIG. 118 identified by circle 119;

FIG. 120 is a sectional view similar to FIG. 118, but showing the cable connector ends in a fully assembled position;

FIG. 121 is an enlarged view of a portion of FIG. 120 identified by circle 121;

FIG. 122 is a rear, elevation view of a power entry connector in accordance with the invention;

FIG. 123 is a plan view of the power entry connector as shown in FIG. 122;

FIG. 124 is a left-side elevation view of the power entry connector as shown in FIG. 122;

FIG. 125 is a front, elevation view of the power connector as shown in FIG. 122;

Figure 122:
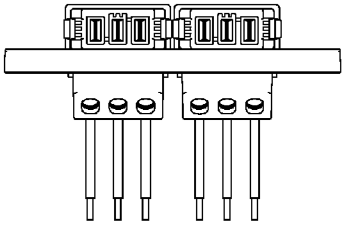
Figure 123:
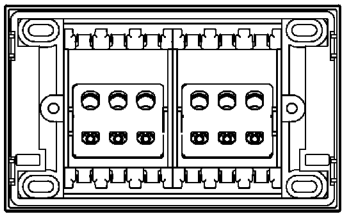
Figure 124:
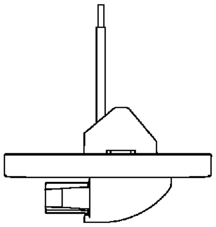
Figure 125:
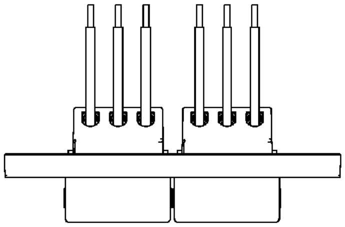
Figure 126:
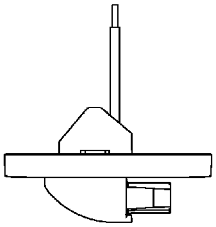
Figure 127:
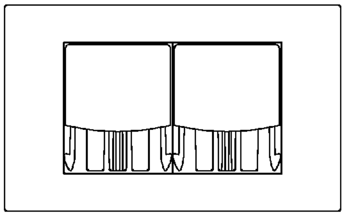
Figure 128:
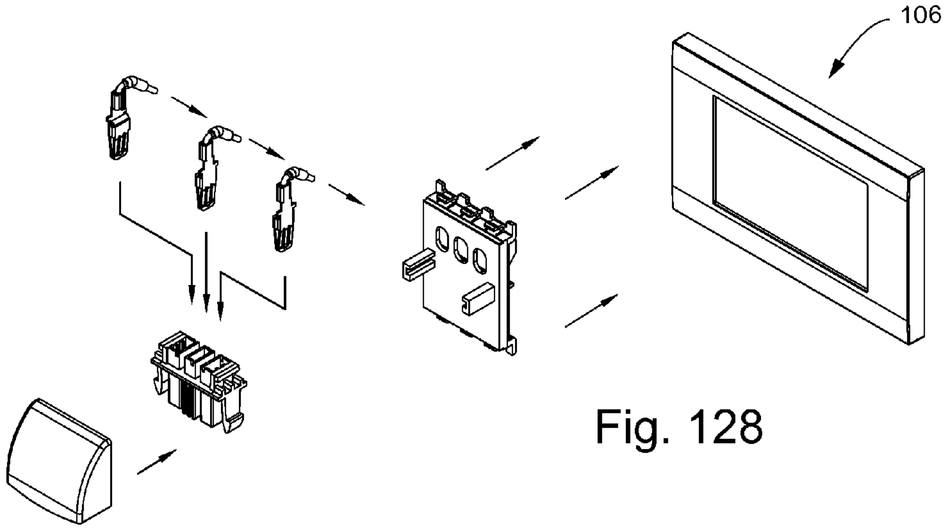
Figure 129:
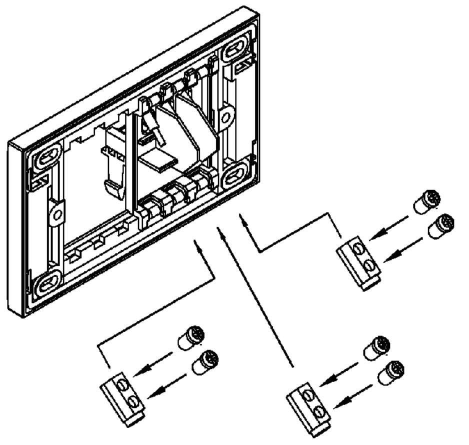
Figure 130:
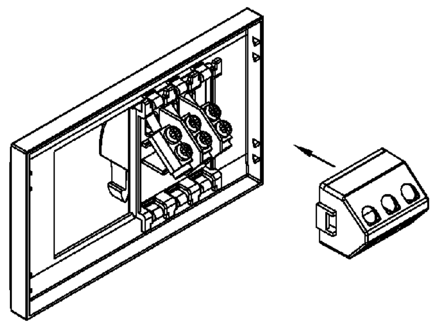
Figure 131:
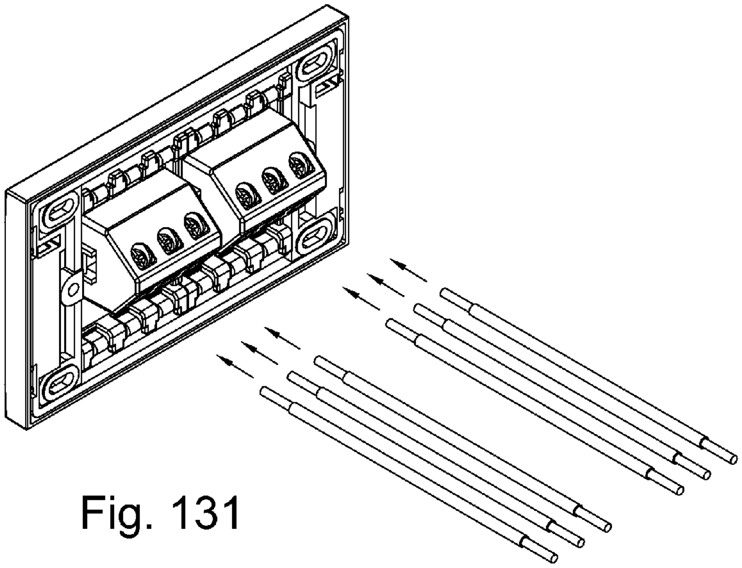
Figure 132:
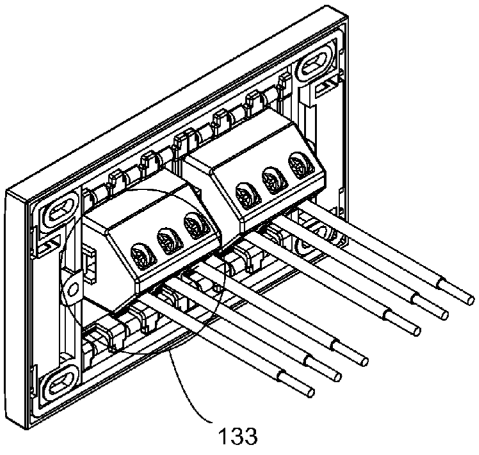
Figure 133:
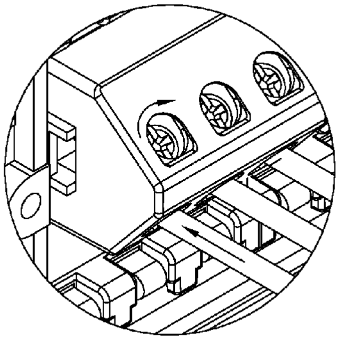
Figure 134:
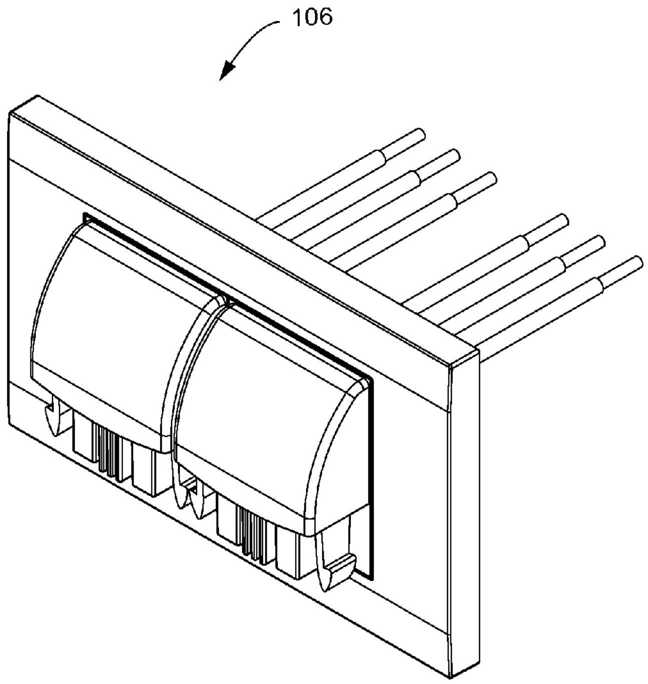
Figure 135:
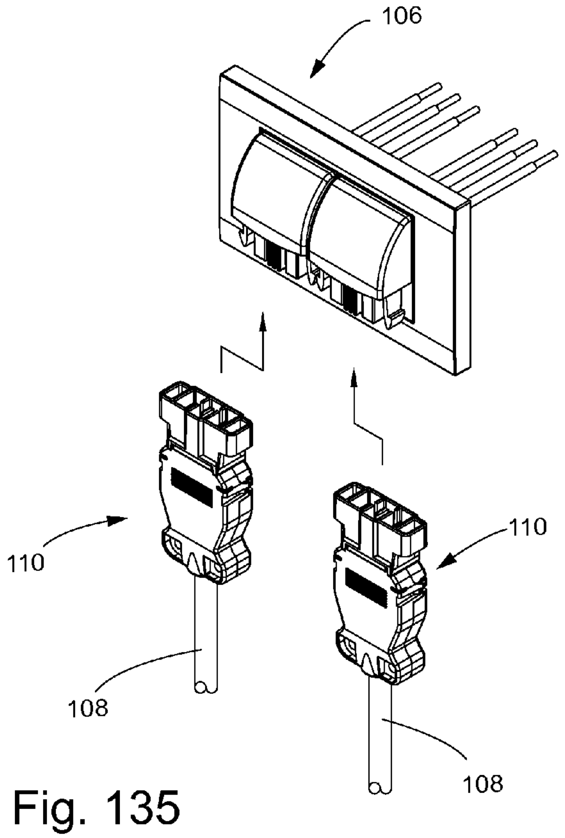
Figure 136:
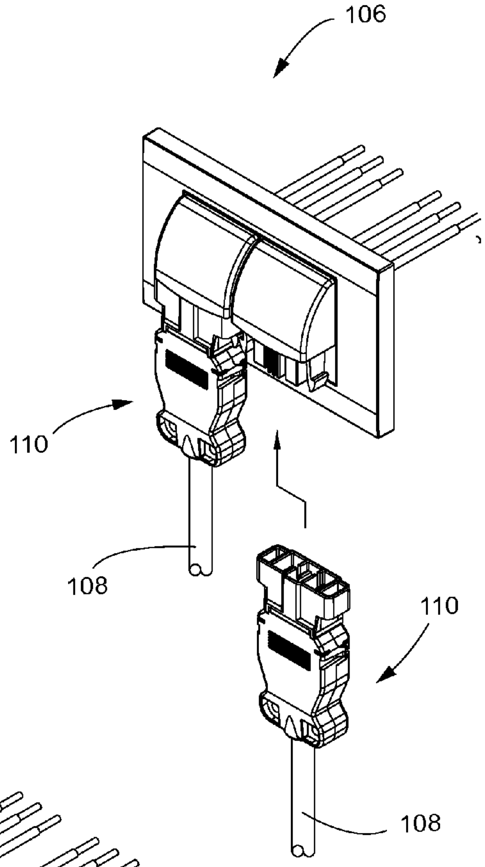
Figure 137:
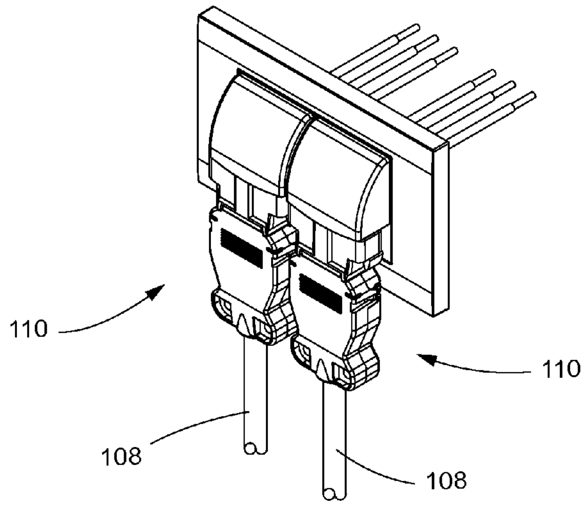
Figure 138:
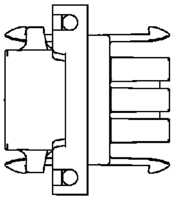
Figure 139:
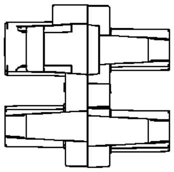
Figure 140:
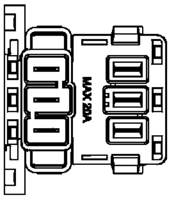
Figure 141:
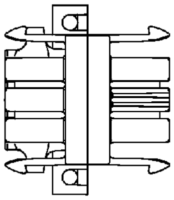
Figure 142:
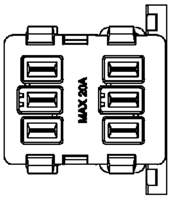
Figure 143:
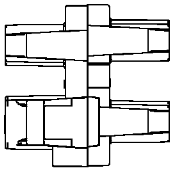
Figure 144:
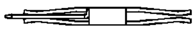
Figure 145:
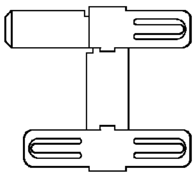
Figure 146:
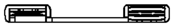
Figure 147:
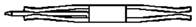
Figure 148:
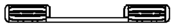
Figure 149:
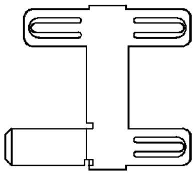
Figure 150:
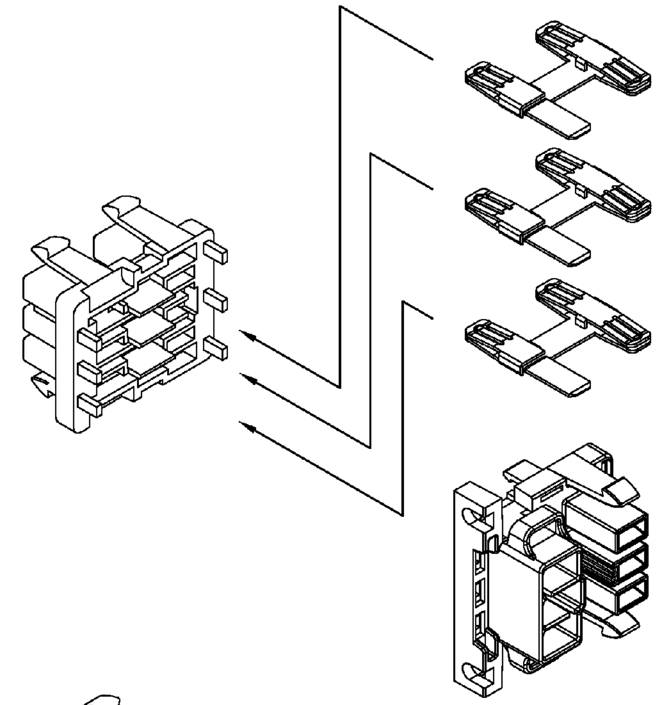
Figure 151:
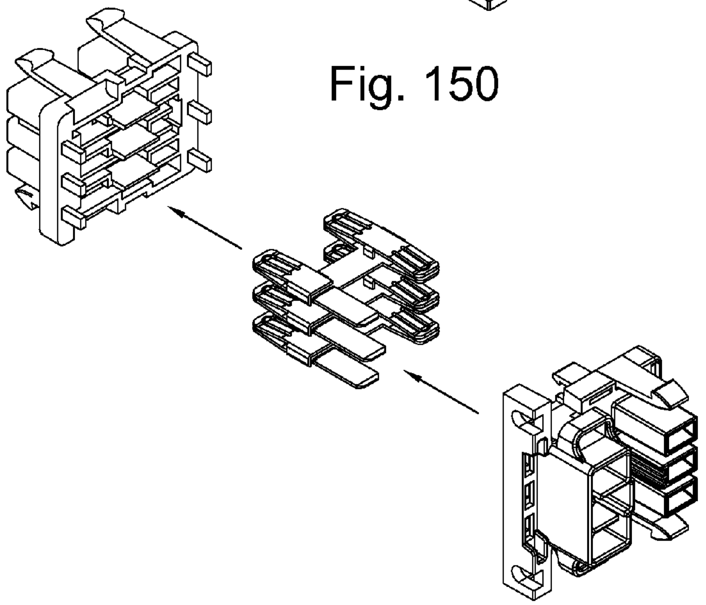
Figure 152:
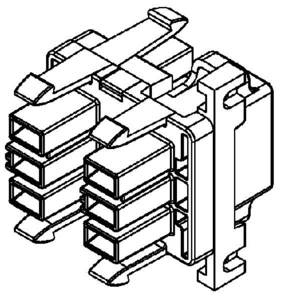
Figure 153:
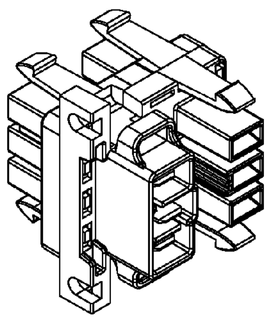
Figure 154:
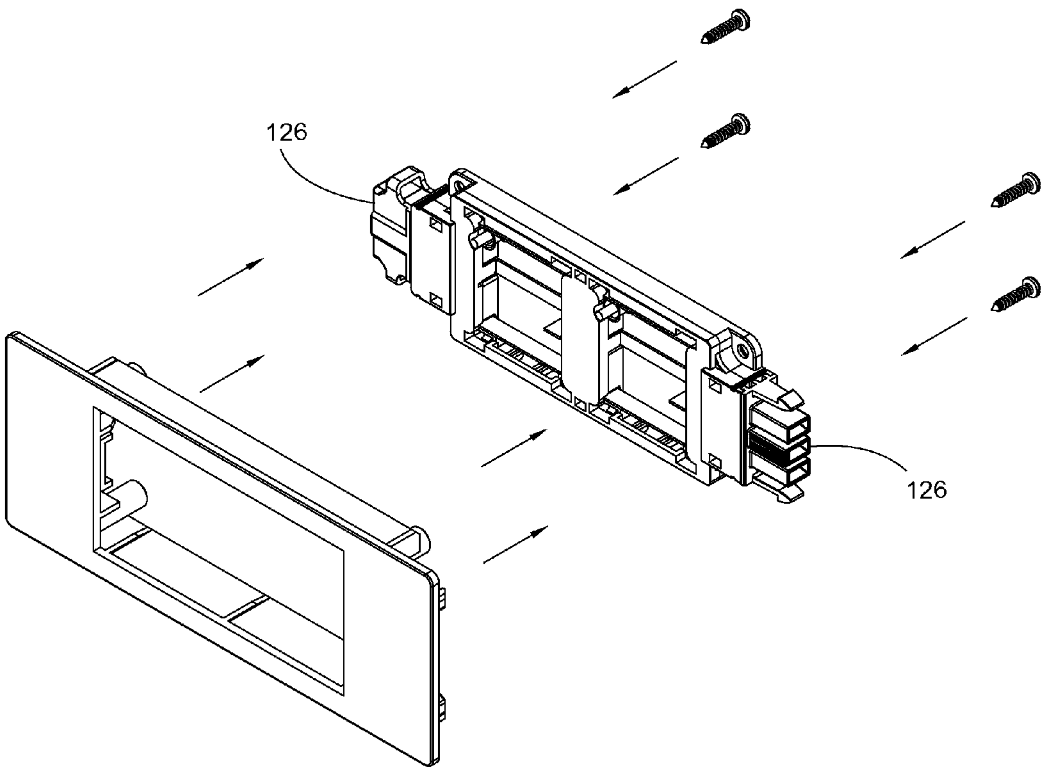
Figure 155:
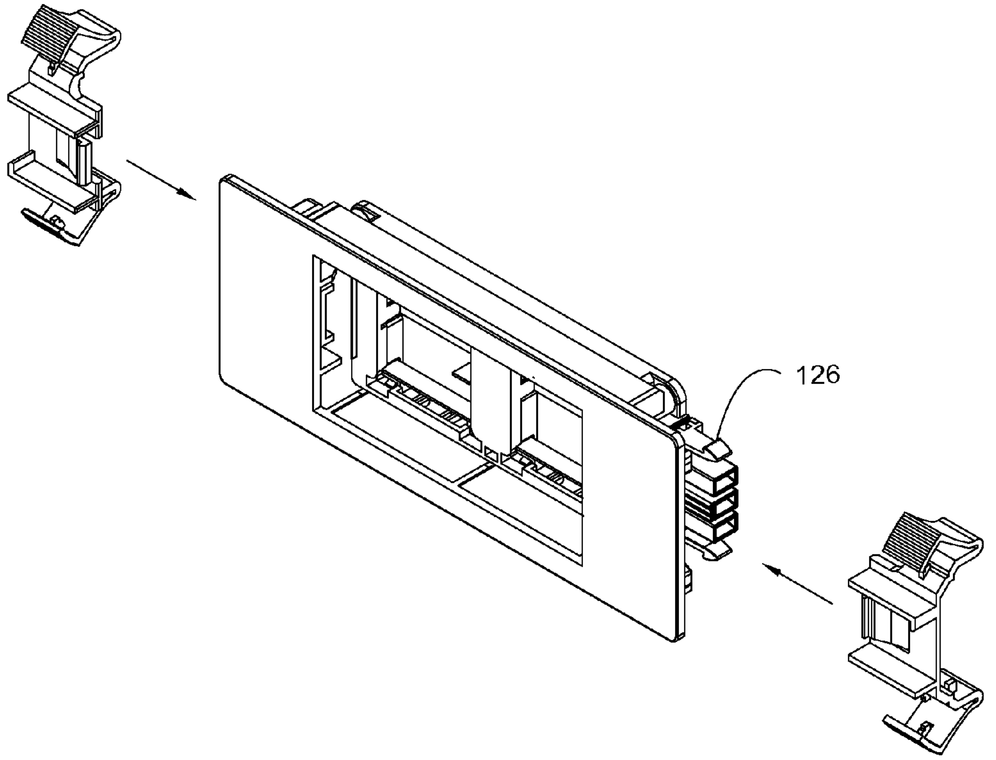
Figure 156:
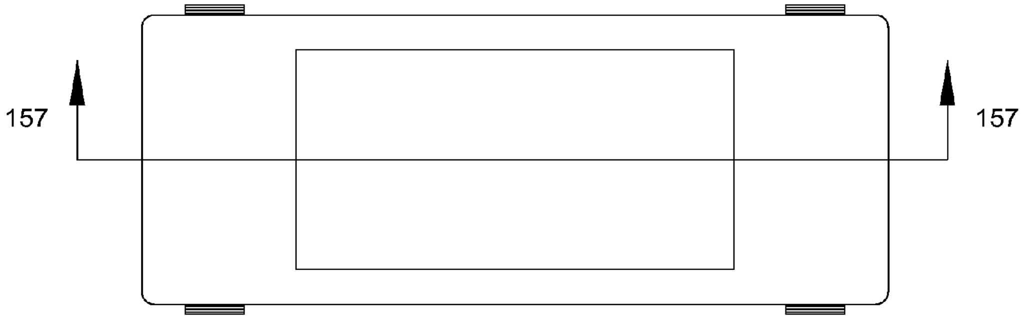
Figure 157:
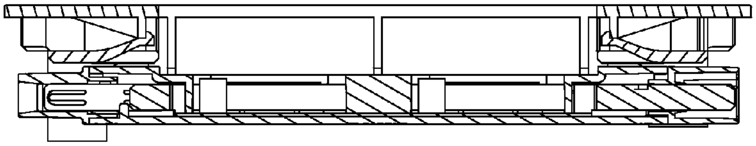
Figure 158:
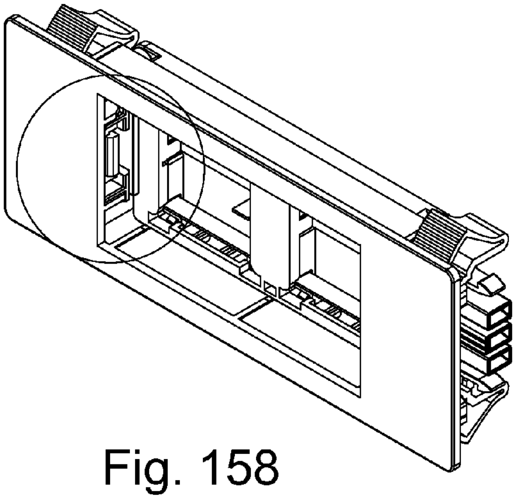
Figure 159:
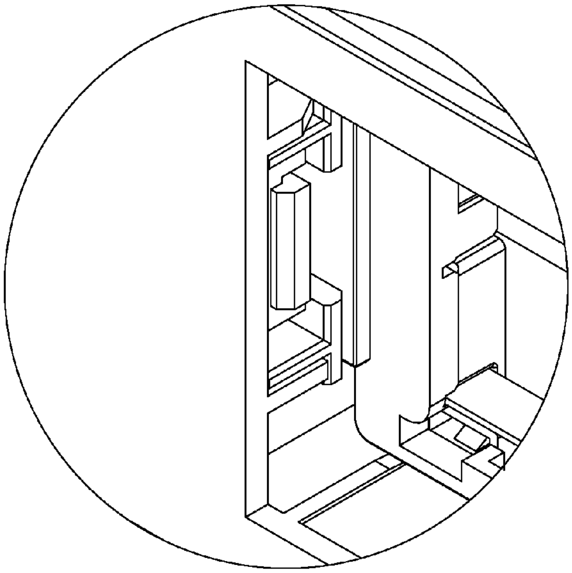
Figure 160:
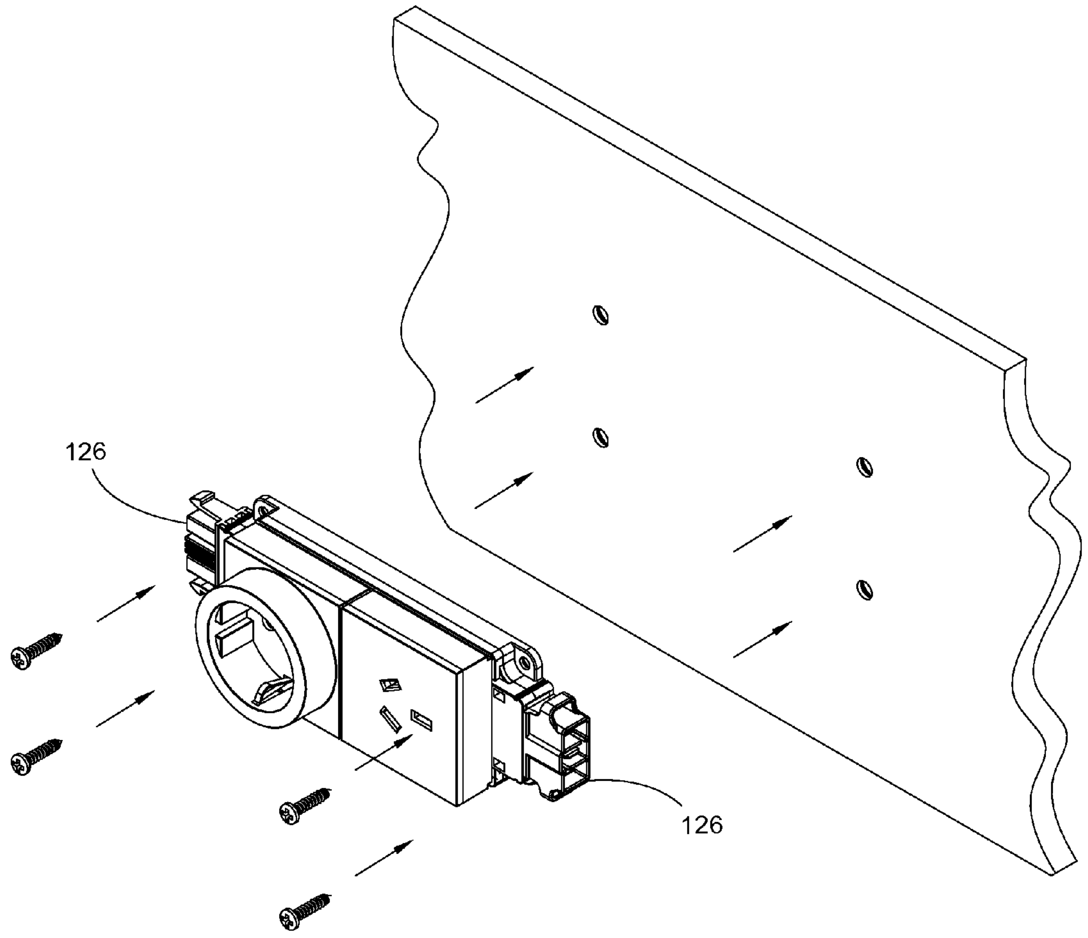
Figure 161:
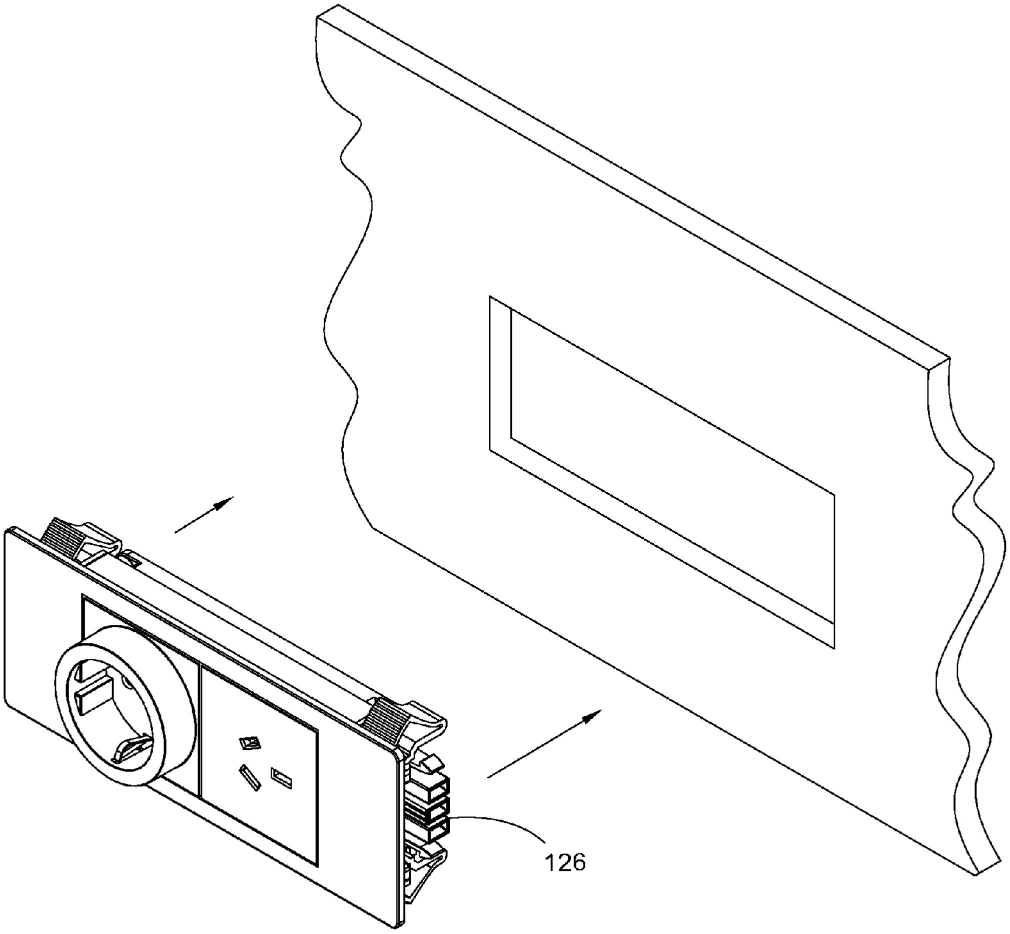
Figure 162:
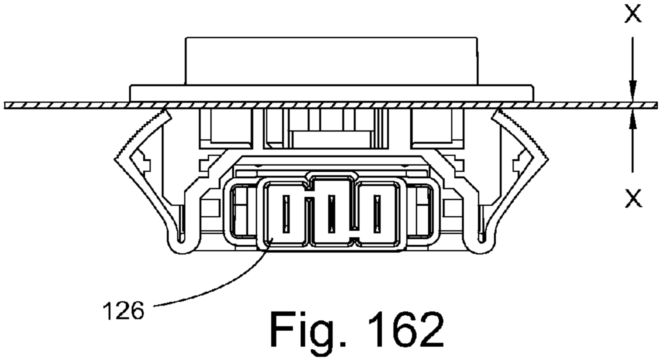
Figure 163:
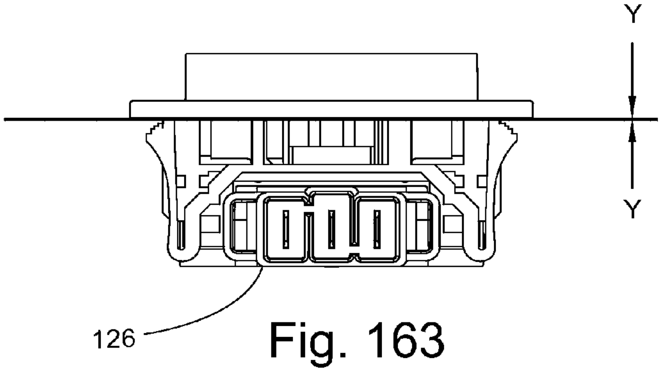
Figure 164:
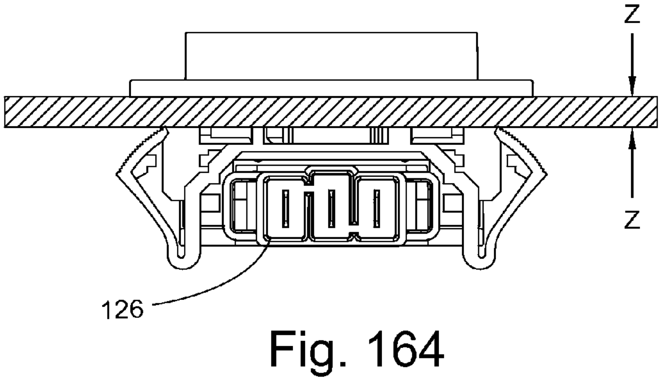
Figure 165:
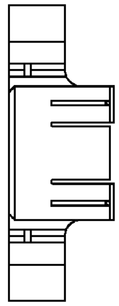
Figure 166:
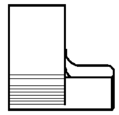
Figure 167:
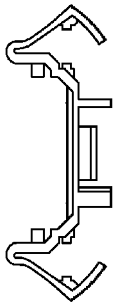
Figure 168:
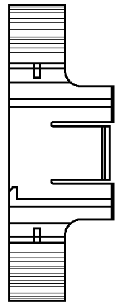
Figure 169:
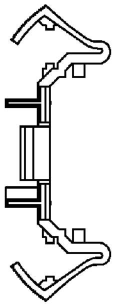
Figure 170:
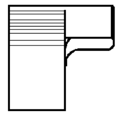
Figure 171:
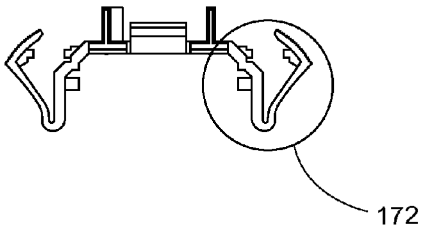
Figure 172:
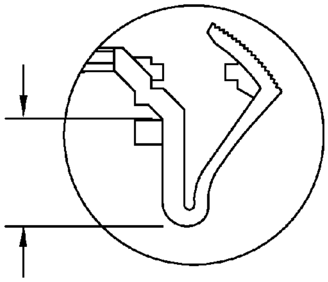
Figure 173:
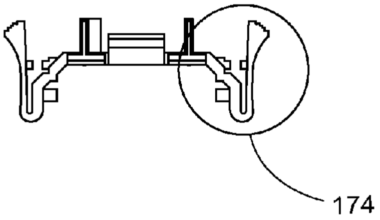
Figure 174:
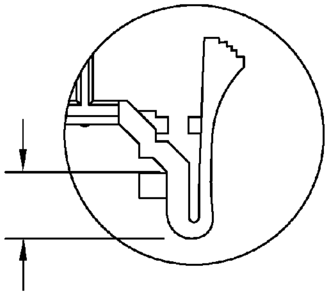
Figure 175:
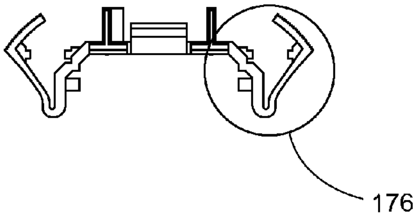
Figure 176:
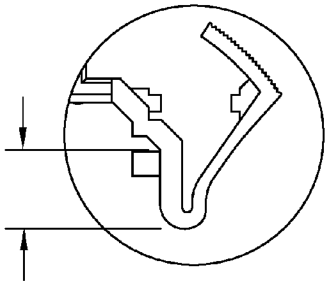
Figure 177:
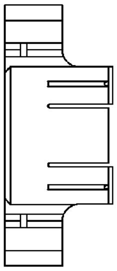
Figure 178:
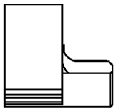
Figure 179:
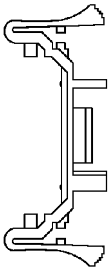
Figure 180:
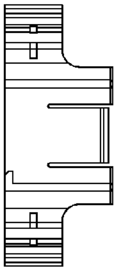
Figure 181:
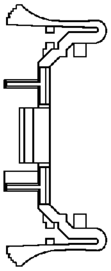

FIG. 126 is a right-side elevation view of the power connector as shown in FIG. 122;

FIG. 127 is an underside view of the power connector as shown in FIG. 122;

FIG. 128 is an exploded view showing various elements of the power connector as shown in FIG. 122;

FIG. 129 is a further, exploded view of the power connector as shown in FIG. 122, and showing the relative positioning of fuses;

FIG. 130 is a further, exploded view of the power connector as shown in FIG. 122, and showing the positioning of the fuse cover for assembly;

FIG. 131 is a perspective view of the power connector as shown in FIG. 122, and showing the power entry wires in position to be received by the connectors of the power connector 122;

FIG. 132 is a perspective view showing the incoming power wires as assembled to the power connector 122;

FIG. 133 is an exploded view of the portion of FIG. 132 identified by circle 133;

FIG. 134 is a perspective view of the fully assembled power entry connector as shown in FIG. 122;

FIG. 135 is a perspective and exploded view of the power entry connector as shown in FIG. 122, as a pair of connector cable ends are positioned so as to be received by the power entry connector;

FIG. 136 is a perspective view similar to FIG. 135, and showing one of the connector cable ends being received by the power entry connector;

FIG. 137 is a perspective view similar to FIG. 135, and showing the cable connector ends in a fully assembled position with the power entry connector;

FIG. 138 is a rear, elevation view of a connector terminal assembly in accordance with the invention;

FIG. 139 is a plan view of the connector terminal assembly as shown in FIG. 138;

FIG. 140 is a left-side end view of the connector terminal as shown in FIG. 138;

FIG. 141 is a front, elevation view of the connector terminal as shown in FIG. 138;

FIG. 142 is a perspective view of the connector terminal as shown in FIG. 138;

FIG. 143 is an underside view of the connector terminal as shown in FIG. 138;

FIG. 144 is a rear, elevation view of a single connector terminal unit which may be used with the connector terminal assembly as shown in FIG. 138;

FIG. 145 is a plan view of the connector terminal unit as shown in FIG. 144;

FIG. 146 is a left-side end view of the connector terminal unit;

FIG. 147 is a front, elevation view of the connector terminal unit;

FIG. 148 is a right-side end view of the connector terminal unit;

FIG. 149 is an underside view of the connector terminal unit;

FIG. 150 is an exploded view showing a set of three connector terminal units as they would be initially positioned for assembly into the connector terminal assembly as shown in FIG. 138;

FIG. 151 is a further, exploded view similar to FIG. 150, and further showing the positioning of the connector terminal units for assembly with the connector terminal assembly;

FIG. 152 is a perspective view of the connector terminal assembly as shown in FIG. 138, in a fully assembled position;

FIG. 153 is a further, perspective view of the connector terminal assembly as shown in FIG. 152, but showing the terminal assembly in an opposing direction;

FIG. 154 is an exploded view of a junction block with may be utilized in accordance with the invention, and further showing a cover plate which may be assembled with the junction block;

FIG. 155 is a perspective view similar to FIG. 154, but showing the cover plate assembled to the junction block, and showing side connectors which may be utilized for securing receptacles within the junction block and cover plate;

FIG. 156 is a front, elevation view of the junction block and cover plate as shown in FIG. 155;

FIG. 157 is a sectional view, taken along section lines 157-157 of FIG. 156;

FIG. 158 is a perspective view of the cover plate and junction block, and side connectors in a fully assembled position;

FIG. 159 is an exploded view of the portion of FIG. 158 identified by circle 159;

FIG. 160 is a perspective, exploded view showing how a junction block and receptacles in accordance with the invention can be mounted to a side board through the use of connecting screws and the like;

FIG. 161 is a perspective and exploded view similar to FIG. 160, but showing the junction block with a cover plate and receptacles, and its positioning so as to be mounted within a rectangular slot within a face board or the like;

FIG. 162 is a side view rotated 90 degrees of a junction block and cover plate in accordance with the invention, and showing the position thereof with a relatively thin face board having a dimension X;

FIG. 163 is a side view similar to FIG. 162, but showing the junction block and cover plate in use with a face board having a relatively thicker dimension Y;

FIG. 164 is a side view similar to FIGS. 162 and 163, but showing use of the junction block cover plate with a face board of a still greater thickness Z;

FIG. 165 is a rear end elevation of a side connector from the junction block of FIG. 161, used for retaining the junction block at a slot within a face board or the like;

FIG. 166 is a left side elevation of the side connector of FIG. 165;

FIG. 167 is a top plan view of the side connector of FIG. 165;

FIG. 168 is a front end elevation of the side connector of FIG. 165;

FIG. 169 is a bottom plan view of the side connector of FIG. 165;

FIG. 170 is a right side elevation of the side connector of FIG. 165;

FIG. 171 is another bottom plan view of the side connector as in FIG. 169;

FIG. 172 is an exploded view of the portion of FIG. 171 identified by circle 172;

FIG. 173 is a bottom plan view of another side connector, shown with its resilient tabs in a compressed configuration;

FIG. 174 is an exploded view of the portion of FIG. 173 identified by circle 174;

FIG. 175 is a bottom plan view of another side connector, shown with its tabs in an expanded configuration;

FIG. 176 is an exploded view of the portion of FIG. 175 identified by circle 176;

FIG. 177 is another rear end elevation of a side connector from the junction block of FIG. 161, used for retaining the junction block at a slot within a face board or the like, and shown with its tabs in a compressed configuration;

FIG. 178 is a left side elevation of the side connector of FIG. 177;

FIG. 179 is a top plan view of the side connector of FIG. 177;

FIG. 180 is a front end elevation of the side connector of FIG. 177;

FIG. 181 is a bottom plan view of the side connector of FIG. 177; and

Figure 182:
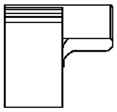

FIG. 182 is a right side elevation of the side connector of FIG. 177.

DETAILED DESCRIPTION OF THE PREFERRED EMBODIMENTS

The principles of the invention are disclosed, by way of example, within international outlet systems which provide for various configurations of outlet receptacles. The international outlet systems in accordance with certain aspects of the invention utilize junction blocks and cable connectors, where various power and communication outlets can be selectively and electrically interconnected to the junction blocks. In this manner, a common junction block can be utilized for a variety of international outlets. These inventive principles will be described with respect to systems illustrated in FIGS. 1-164.

Figure 1:
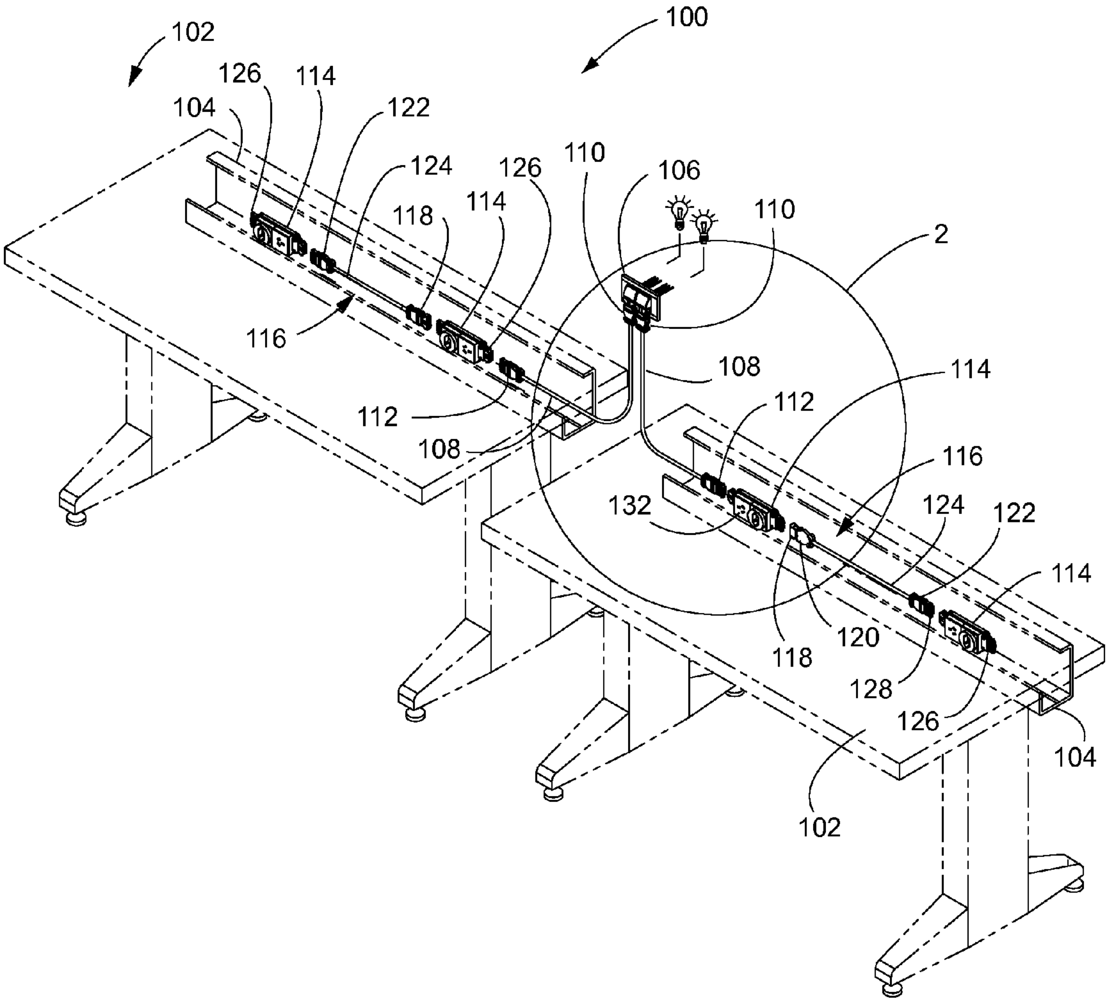
FIG. 1 is a perspective view of a pair of work surfaces having junction blocks and electrical receptacle blocks in accordance with the invention.

To provide for one example background of where international outlet systems in accordance with the invention may be utilized, FIG. 1 illustrates a work surface international outlet system 100. As shown in FIG. 1, the work surface international outlet system 100 is being used with a pair of work surfaces 102. Positioned below the upper surface of each of the work surfaces 102 is a raceway 104. Each of the raceways 104 can be positioned and include appropriate components so as to support various elements of the international outlet system 100.

With respect to the outlet system 100 itself, it includes an incoming power entry connector 106 which can be connected to a source of incoming external power (not shown). Connected to the power entry connector 106 are a pair of power entry cables 108. The cables 108 are connected through power entry cable connectors 110. The opposing ends of the power entry cables 108 are connected to opposing power entry cable connectors 112. Each of the opposing power entry cable connectors 112 is electrically and releasably, physically connected to a junction block 114. This connection occurs at one end of the junction blocks 114. Connector cable assemblies 116 are connected at one end to the opposing end of each of the junction blocks 114. The opposing end of the connector cable assemblies 116 is electrically connected to a further set of junction blocks 114. This electrical interconnection can continue through a significant number of connector cable assemblies 116 at junction blocks 114 so as to provide for a distribution assembly for both power systems and communication systems.

Each of the connector cable assemblies 116 include end connectors 118. The end connector 118 include a first end connector 120, and a second end connector 122. Interconnecting together the first and second end connectors 120, 122 is a cable 124. It should be noted that if desired, and in accordance with certain embodiments of international outlet systems in accordance with the invention, one of the end connectors 118 can be a female end connector, while the opposing end connector 118 can be a male end connector. In this regard, it is also noted that each of the junction blocks 114 include a pair of end connectors 126. The junction block end connectors 126 can include a first junction block end connector 128, and a second and opposing junction block end connector 130. As will be apparent from subsequent description herein, it is advantageous for one of the junction block end connectors 126 to be a female end connector, while the opposing junction block end connector 126 is a male end connector.

Figure 2:
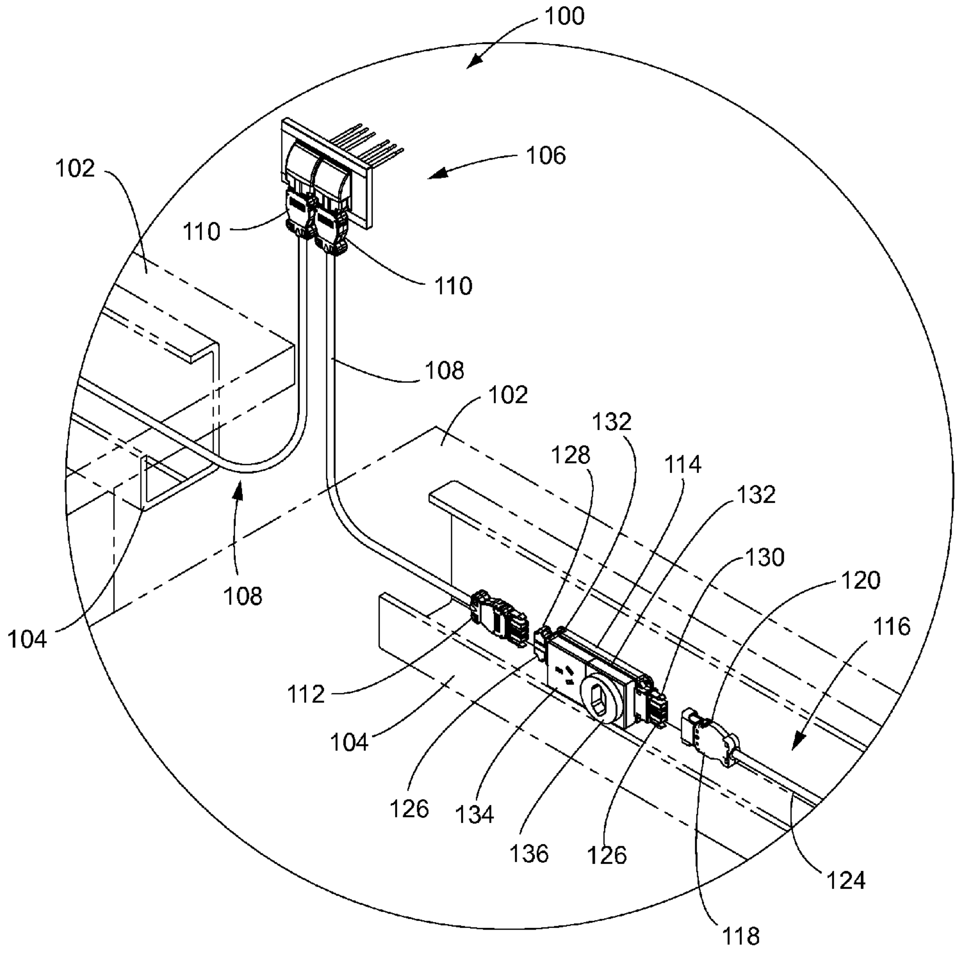
FIG. 2 is an enlarged view of a portion of the illustration shown in FIG. 1.

As is also particularly shown in FIG. 2, the junction blocks 114 can be utilized to selectively receive receptacle blocks 132. With the junction block 114 as shown in FIG. 2, a pair of outlet receptacle blocks 132 are shown as comprising a first outlet receptacle block 134 having a first particular outlet configuration, and a second electrical outlet receptacle block 136, having a differing electrical outlet configuration.

Figure 3:
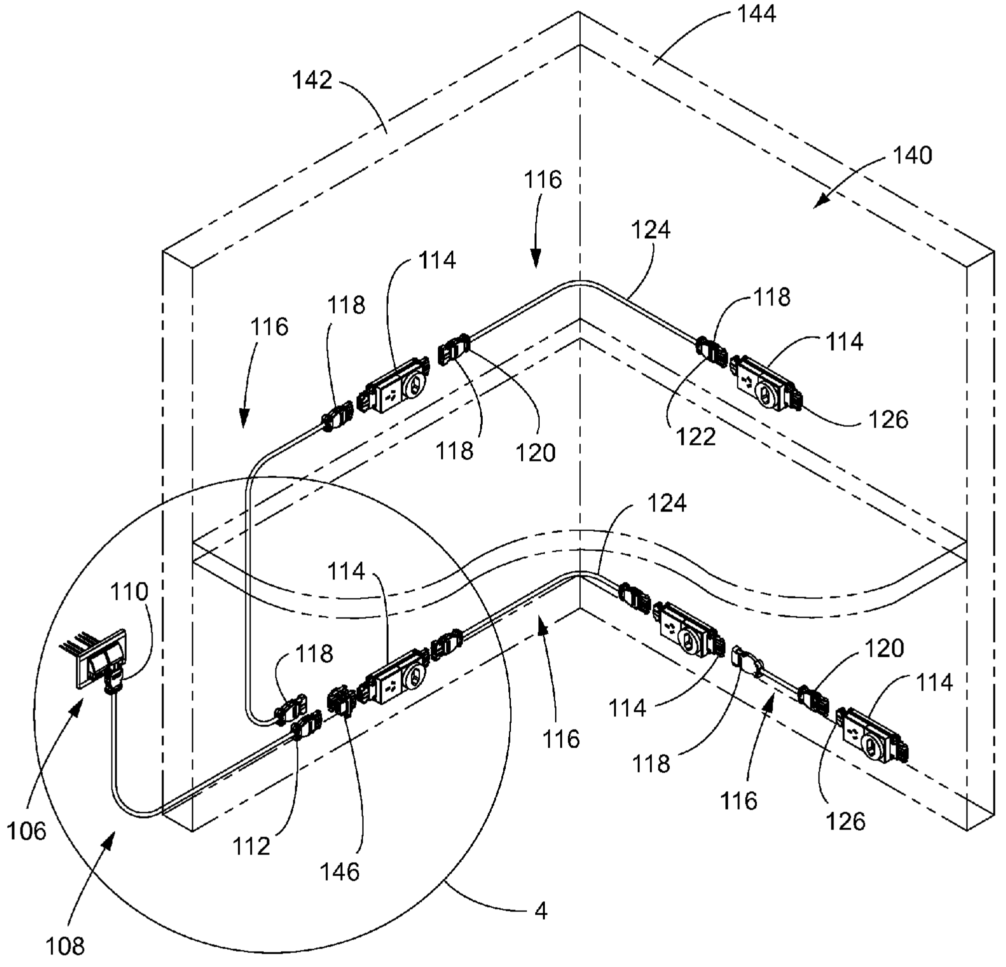
FIG. 3 is a perspective view of a pair of adjacent wall panels and electrical interconnection assemblies arranged in the panels, with the interconnection assemblies being part of a distribution system in accordance with the invention.
Figure 4:
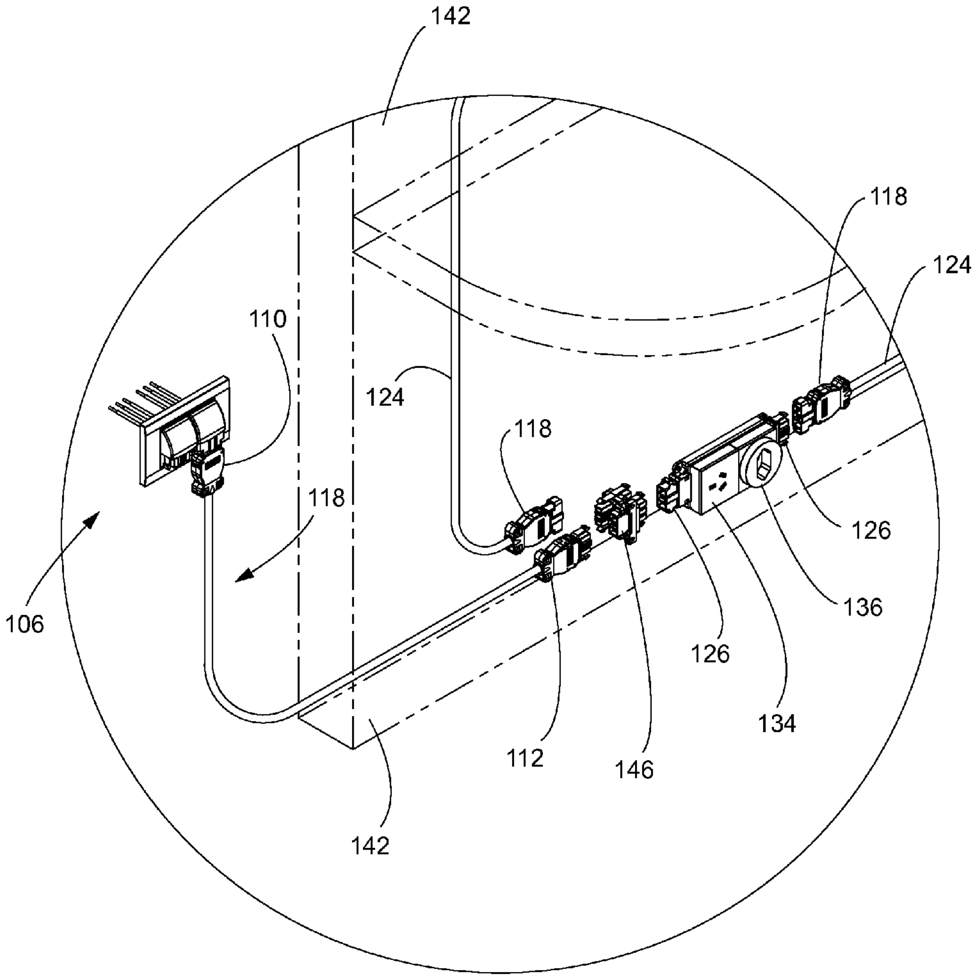
FIG. 4 is an enlarged view of a portion of the distribution system shown in FIG. 3, and specifically formed within circle 4 of FIG. 3.
Figure 5:
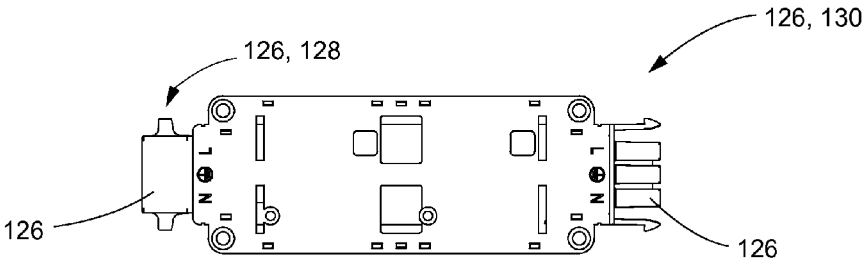
FIG. 5 is a rear view of a junction block in accordance with the invention.
Figure 6:
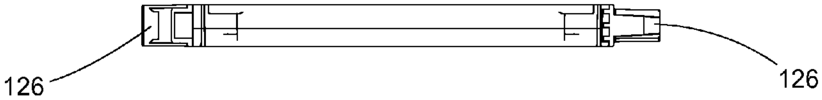
FIG. 6 is a plan view of a junction block in accordance with the invention.
Figure 7:
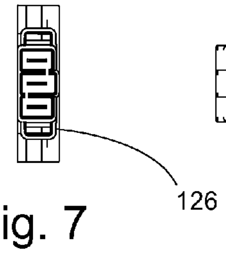
FIG. 7 is a left-side elevation view of a junction block in accordance with the invention.
Figure 8:
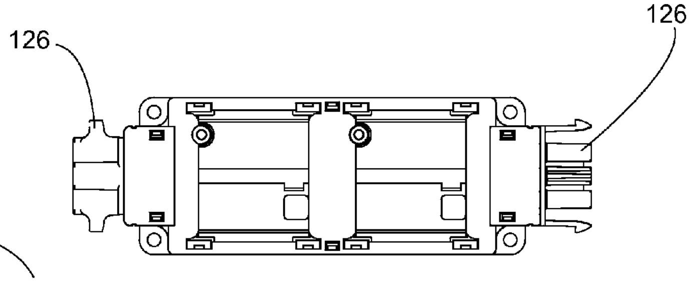
FIG. 8 is a front, elevation view of a junction block in accordance with the invention, with the absence of any electric receptacle blocks.
Figure 9:
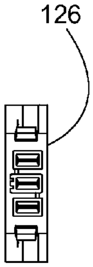
FIG. 9 is a right-side elevation view of the junction block of FIG. 8.
Figure 10:
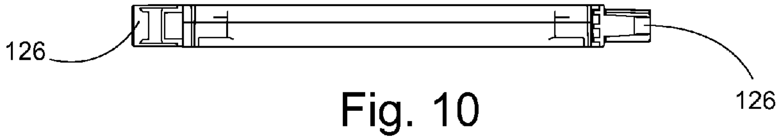
FIG. 10 is an underside view of the junction block shown in FIG. 8.
Figure 11:
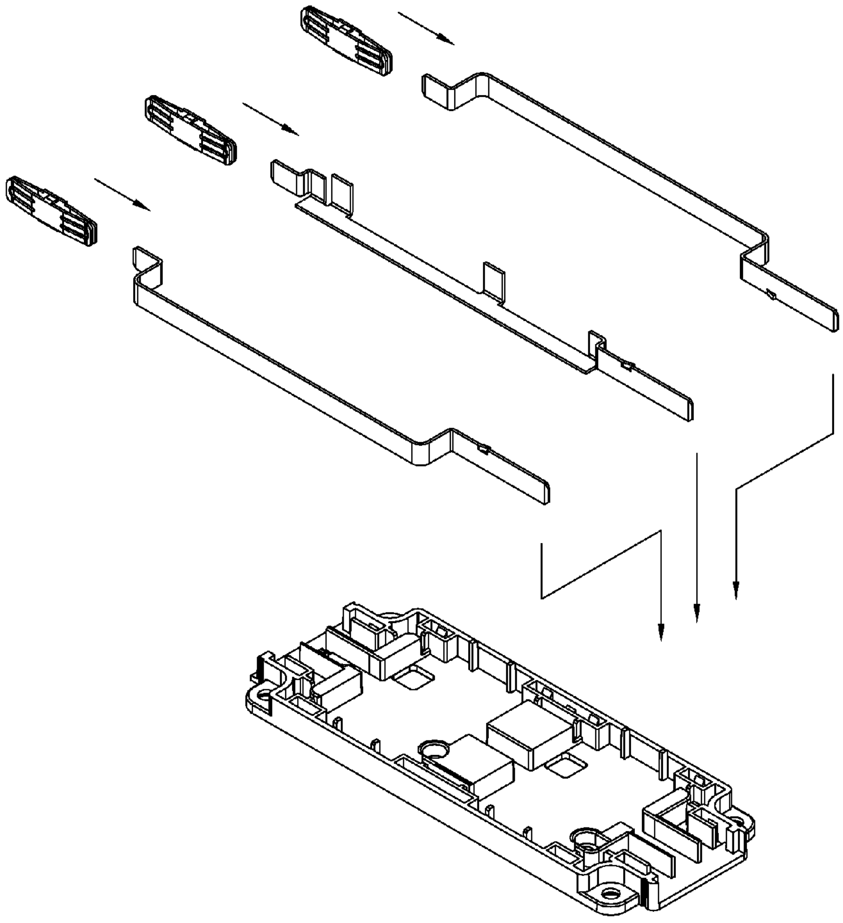
FIG. 11 is an exploded, perspective view of a junction block in accordance with the invention, showing the bus bar configuration for the hot, neutral and ground connectors as they are to be inserted into the junction block.
Figure 12:
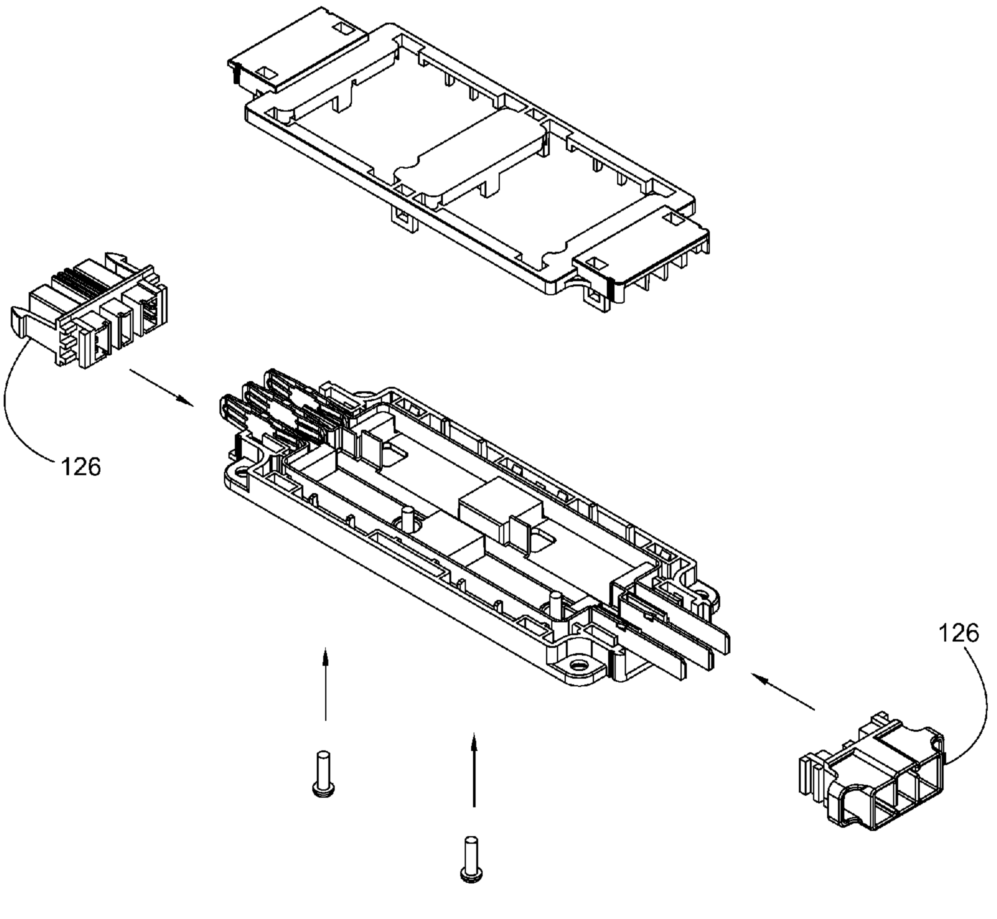
FIG. 12 is a further, exploded view of the junction block in accordance with the invention, showing the bus bars in place, and the end connectors and front cover being in position so as to be connected to the base housing of the junction block.
Figure 13:
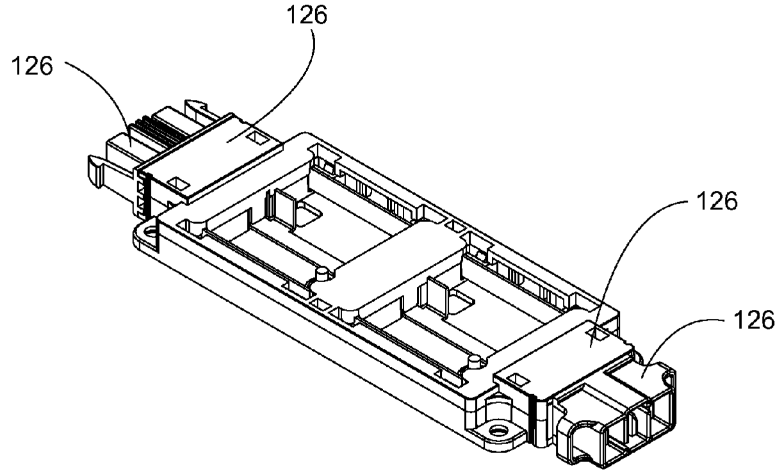
FIG. 13 is a front, perspective view of the fully assembled junction block.
Figure 14:
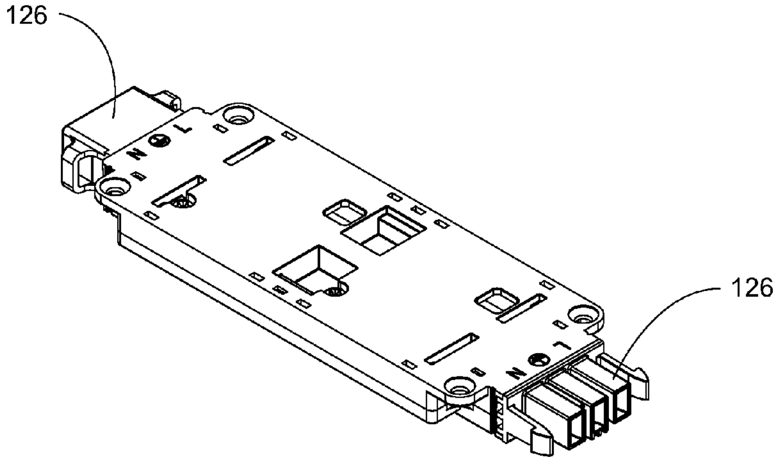
FIG. 14 is a rear, perspective view of the junction block shown in FIG. 13.
Figure 15:
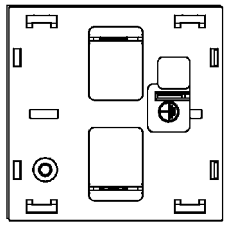
FIG. 15 is a rear, elevation view of a first international receptacle which may be utilized in accordance with the invention.
Figure 16:
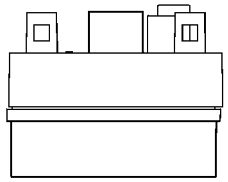
FIG. 16 is a plan view of the receptacle shown in FIG. 15.
Figure 17:
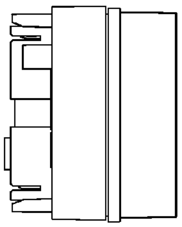
FIG. 17 is a left-side end view of the receptacle shown in FIG. 15.
Figure 18:
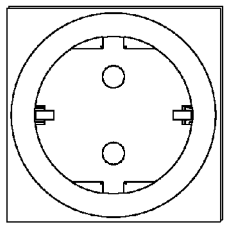
FIG. 18 is a front, elevation view of the receptacle shown in FIG. 15.
Figure 19:
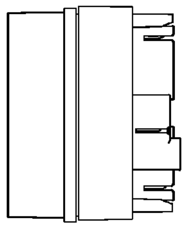
FIG. 19 is a right-side end view of the receptacle shown in FIG. 15.
Figure 20:
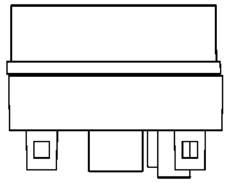
FIG. 20 is an underside view of the receptacle shown in FIG. 15.
Figure 21:
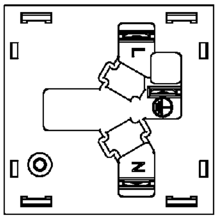
FIG. 21 is a rear, elevation view of a second outlet receptacle in accordance with the invention, with the receptacle having a three-pronged configuration.
Figure 22:
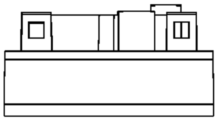
FIG. 22 is a plan view of the receptacle as shown in FIG. 21.
Figure 23:
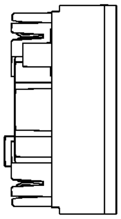
FIG. 23 is a left-side end view of the receptacle as shown in FIG. 21.
Figure 24:
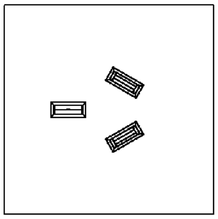
FIG. 24 is a front, elevation view of the receptacle as shown in FIG. 21, and illustrating the three terminals for receipt of three prongs of an electrical plug.
Figure 25:
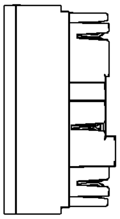
FIG. 25 is a right-side end view of the receptacle as shown in FIG. 21.
Figure 26:
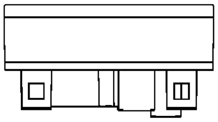
FIG. 26 is an underside view of the receptacle as shown in FIG. 21.
Figure 27:
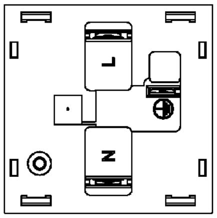
FIG. 27 is a rear, elevation view of a third embodiment of a receptacle in accordance with the invention, with the receptacle having three sockets for receiving circular prongs of a plug.
Figure 28:
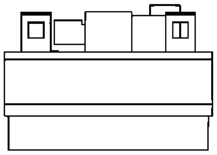
FIG. 28 is a plan view of the receptacle as shown in FIG. 27.
Figure 29:
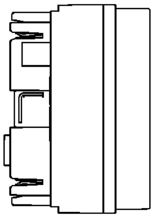
FIG. 29 is a left-side end view of the receptacle shown in FIG. 27.
Figure 30:
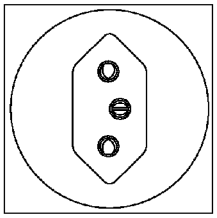
FIG. 30 is a front, elevation view of the receptacle as shown in FIG. 27, and showing the three circular sockets for receipt of circular plug prongs.
Figure 31:
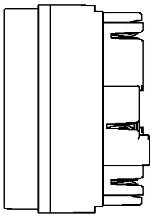
FIG. 31 is a right-side end view of the receptacle as shown in FIG. 27.
Figure 32:
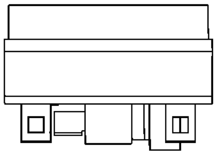
FIG. 32 is an underside view of the receptacle as shown in FIG. 27.
Figure 33:
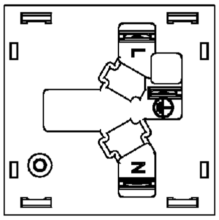
FIG. 33 is a rear, elevation view of a fourth embodiment of a receptacle in accordance with the invention, with the receptacles having three sockets, with one of the sockets having a T-shaped configuration.
Figure 34:
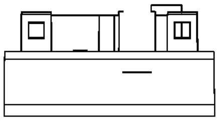
FIG. 34 is a plan view of the receptacle as shown in FIG. 33.
Figure 35:
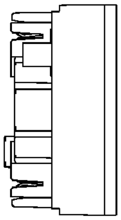
FIG. 35 is a left-side end view of the receptacle as shown in FIG. 33.
Figure 36:
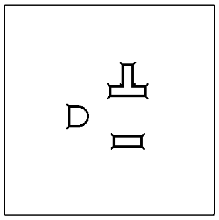
FIG. 36 is a front, elevation view of the receptacle as shown in FIG. 33.
Figure 37:
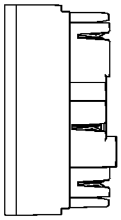
FIG. 37 is a right-side end view of the receptacle as shown in FIG. 33.
Figure 38:
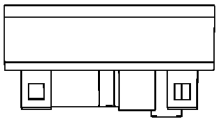
FIG. 38 is an underside view of the receptacle as shown in FIG. 33.
Figure 39:
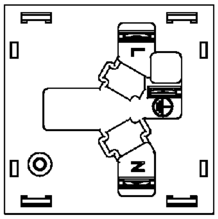
FIG. 39 is a rear, elevation view of a fifth embodiment of a receptacle in accordance with the invention.
Figure 40:
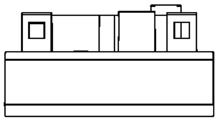
FIG. 40 is a plan view of the receptacle as shown in FIG. 39.
Figure 41:
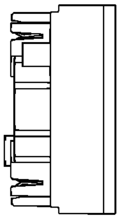
FIG. 41 is a left-side end view of the receptacle as shown in FIG. 39.
Figure 42:
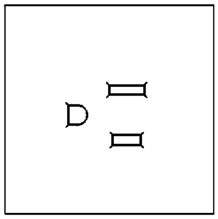
FIG. 42 is a front, elevation view of the receptacle as shown in FIG. 39, and showing a set of three sockets having a polarized configuration.
Figure 43:
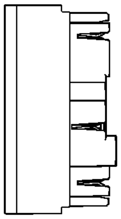
FIG. 43 is a right-side end view of the receptacle as shown in FIG. 39.
Figure 44:
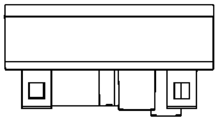
FIG. 44 is an underside view of the receptacle as shown in FIG. 39.
Figure 45:
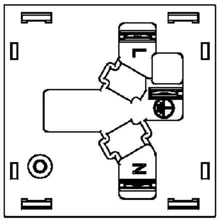
FIG. 45 is a rear, elevation view of a sixth embodiment of a receptacle in accordance with the invention.
Figure 46:
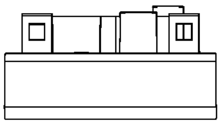
FIG. 46 is a plan view of the receptacle as shown in FIG. 45.
Figure 47:
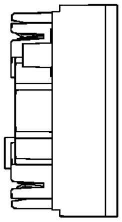
FIG. 47 is a left-side end view of the receptacle as shown in FIG. 45.
Figure 48:
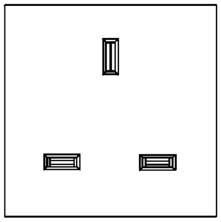
FIG. 48 is a front, elevation view of the receptacle as shown in FIG. 45, and showing the receptacle as having a three socket configuration.
Figure 49:
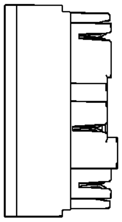
FIG. 49 is a right-side end view of the receptacle as shown in FIG. 45.
Figure 50:
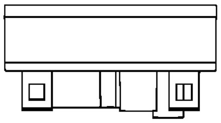
FIG. 50 is an underside view of the receptacle as shown in FIG. 45.
Figure 51:
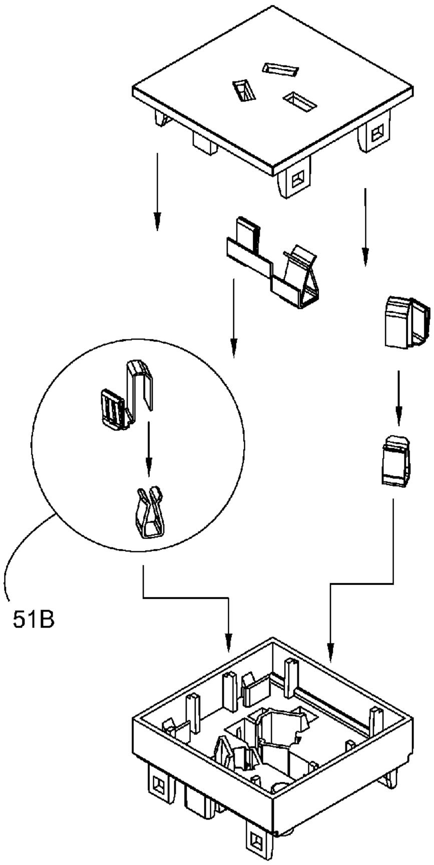
FIG. 51 is an exploded view of the second embodiment of a receptacle in accordance with the invention, as illustrated in FIGS. 21-26, with FIG. 51 showing the receptacle cover and the base outlet housing, and showing the clip terminals prior to interconnection.
Figure 51A:
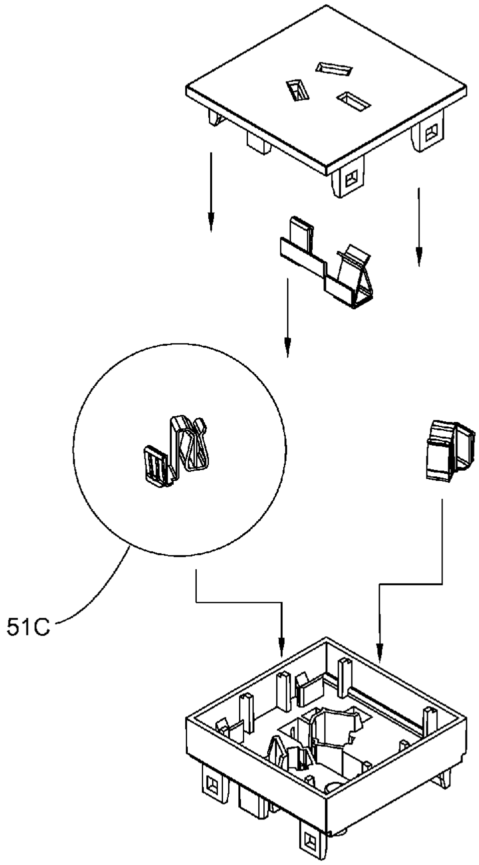
FIG. 51A is similar to FIG. 51, but shows the terminal connector clips in a connected configuration.
Figure 51B:
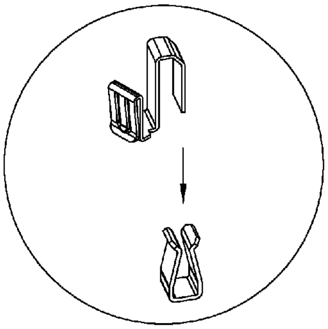
FIG. 51B is an enlarged view of the area identified by circle 51B in FIG. 51.
Figure 51C:
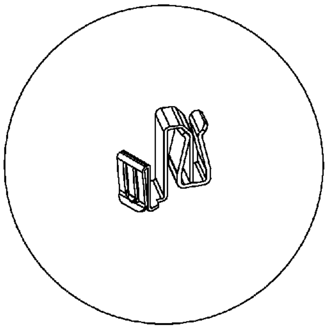
FIG. 51C is an enlarged view of the area identified by circle 51C in FIG. 51A.
Figure 52:
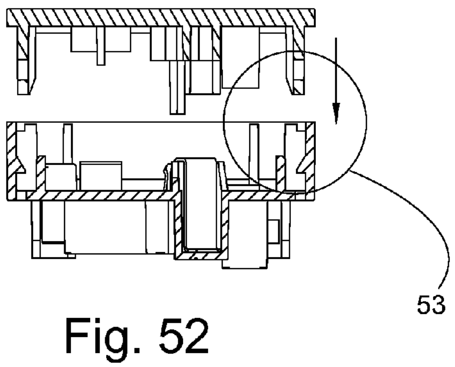
FIG. 52 is a side, sectional view of the receptacle as shown in FIG. 51, and showing the receptacle cover plate prior to interconnection with the receptacle base housing.
Figure 53:
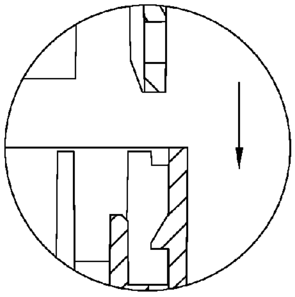
FIG. 53 is an enlarged view of the area identified by circle 53 in FIG. 52.
Figure 54:
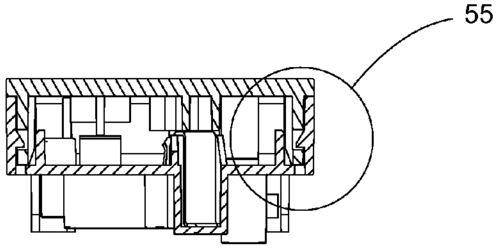
FIG. 54 is a sectional view similar to FIG. 52, but showing the cover plate as it is releasably secured to the receptacle base housing.
Figure 55:
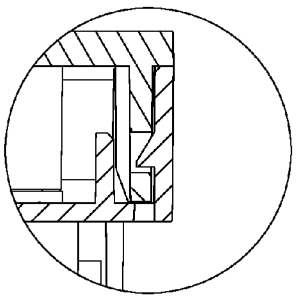
FIG. 55 is an enlarged view of the area identified by circle 55 in FIG. 54.
Figure 56:
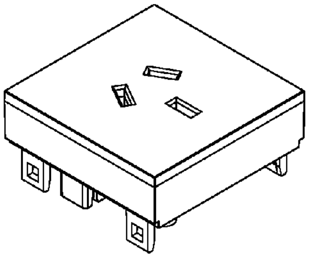
FIG. 56 is a perspective view of the assembled receptacle originally shown in FIGS. 21-16.
Figure 57:
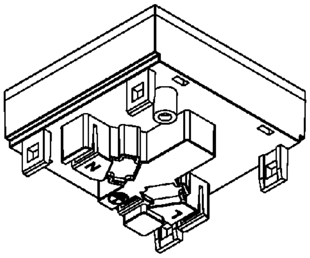
FIG. 57 is an underside, perspective view of the receptacle as shown in FIG. 56.
Figure 58:
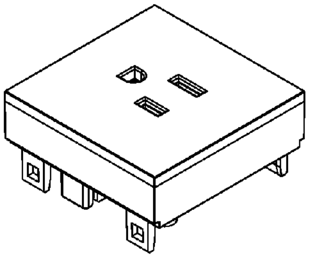
FIG. 58 is a perspective view of an assembled receptacle as previously shown in FIGS. 39-44.
Figure 59:
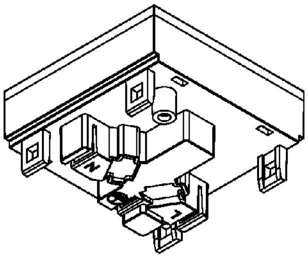
FIG. 59 is an underside, perspective view of the receptacle as shown in FIG. 58.
Figure 60:
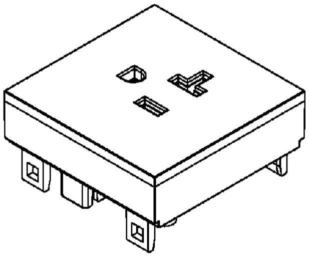
FIG. 60 is a perspective view of an assembled receptacle corresponding to the receptacle previously illustrated in FIGS. 33-37.
Figure 61:
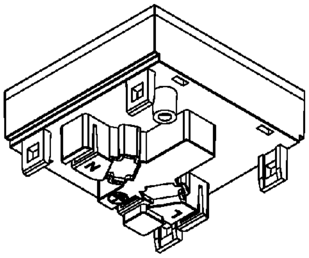
FIG. 61 is an underside, perspective view of the receptacle as shown in FIG. 60.
Figure 62:
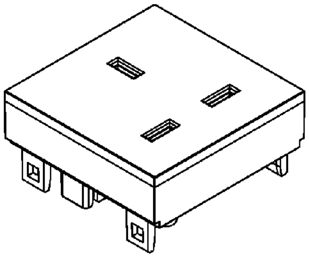
FIG. 62 is a perspective view of the assembled receptacle as previously shown in FIGS. 45-49.
Figure 63:
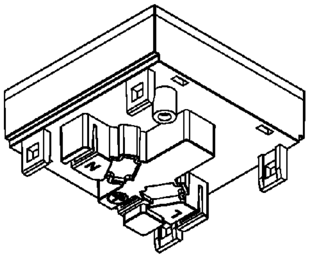
FIG. 63 is an underside perspective view of the receptacle as shown in FIG. 62.
Figure 64:
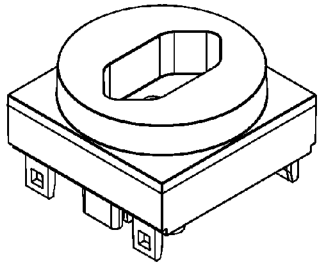
FIG. 64 is a perspective view of the fully assembled receptacle as previously illustrated in FIGS. 27-32.
Figure 65:
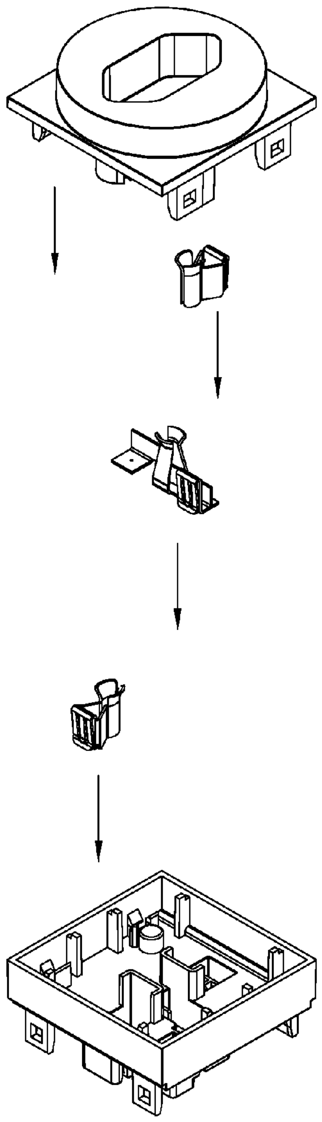
FIG. 65 is an exploded view of the receptacle as shown in FIG. 64, showing the receptacle cover plate as it is being assembled to the receptacle base housing.
Figure 66:
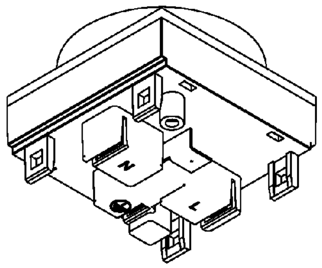
FIG. 66 is an underside, perspective view of the receptacle as shown in FIG. 64.
Figure 67:
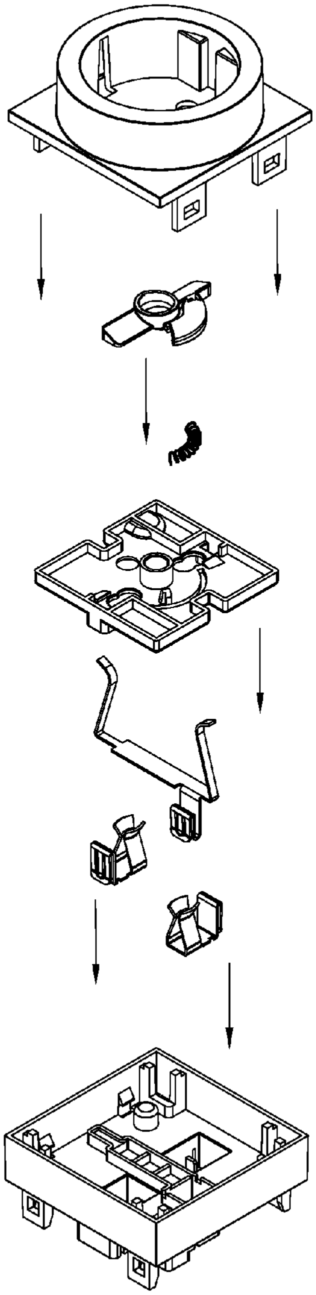
FIG. 67 is a perspective and exploded view of the receptacle previously illustrated in FIGS. 15-20, and illustrating the receptacle cover plate as it is being assembled with the receptacle base housing.
Figure 68:
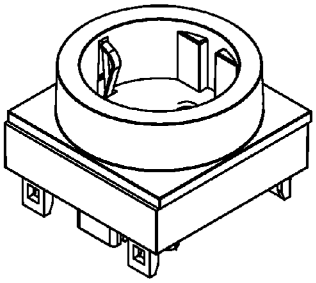
FIG. 68 is a perspective view of the receptacle as shown in FIG. 67, but shown in a fully assembled state.
Figure 69:
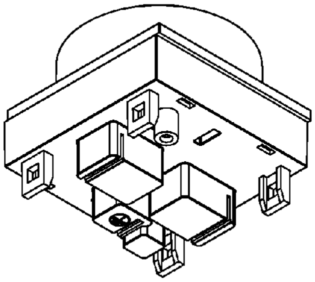
FIG. 69 is an underside, perspective view of the receptacle as shown in FIG. 68.
Figure 70A:
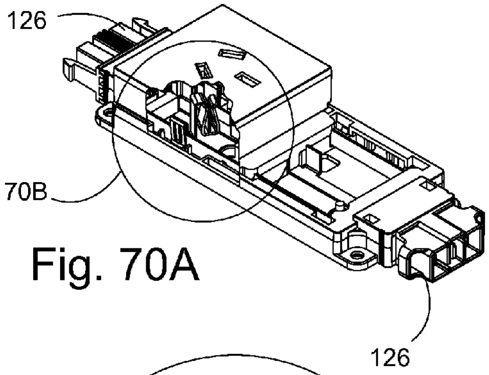
FIG. 70A is a perspective view similar to FIG. 70, but showing the second receptacle and the junction block in an assembled state.
Figure 70:
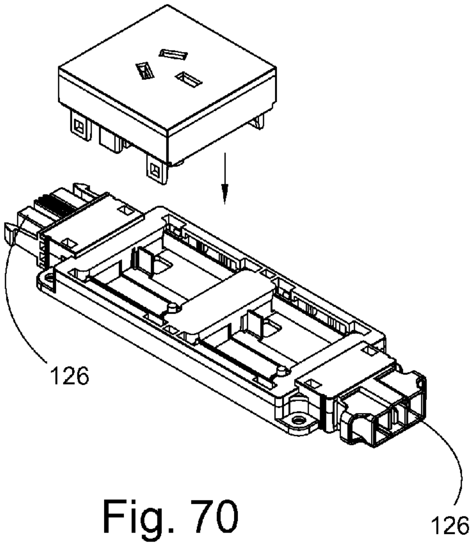
FIG. 70 is an exploded view showing the second receptacle previously illustrated in FIGS. 21-26 as it is being inserted into a junction block.
Figure 70B:
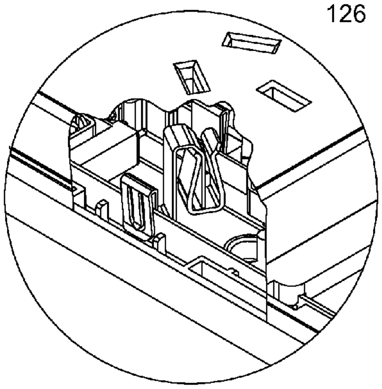
FIG. 70B is an enlarged view of the portion of FIG. 70A identified by circle 70B.
Figure 71:
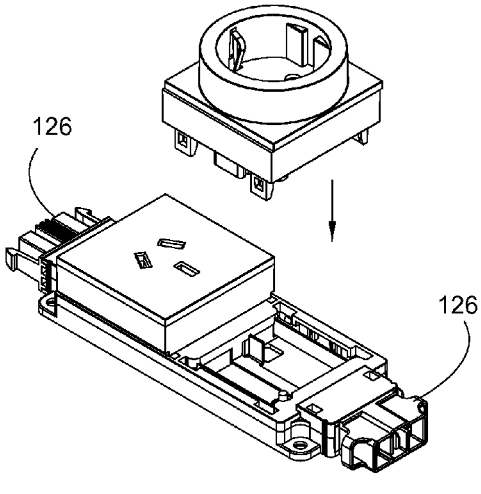
FIG. 71 is an exploded view of the first receptacle previously illustrated in FIGS. 15-20 as it is being inserted into a junction block.
Figure 72:
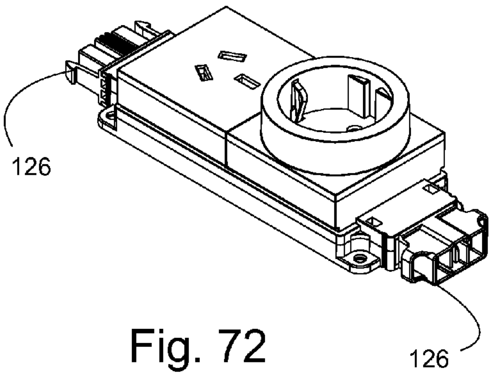
FIG. 72 is a perspective view similar to FIG. 72, but showing the first receptacle in a fully assembled state with the junction block.
Figure 73:
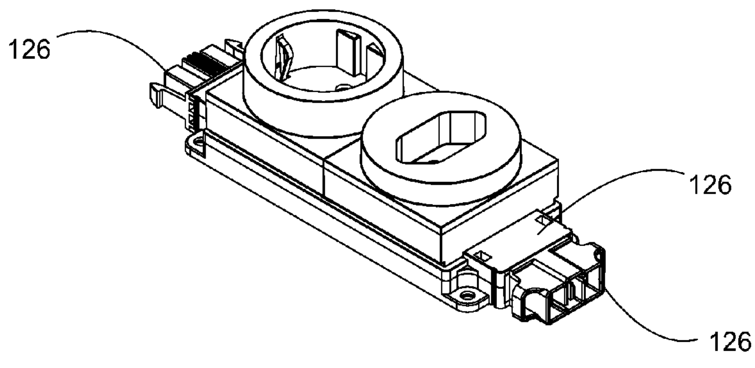
FIG. 73 is a perspective view of a junction block showing its use with the first receptacle as shown in FIGS. 15-20 and the third receptacle as shown in FIGS. 27-32.
Figure 74:
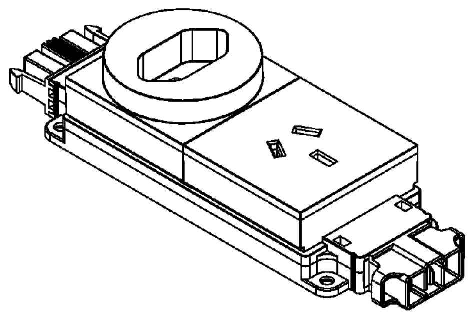
FIG. 74 is a perspective view similar to FIG. 73, but showing the junction block is use with the third receptacle as shown in FIGS. 27-32 and the second receptacle as shown in FIGS. 21-26.
Figure 75:
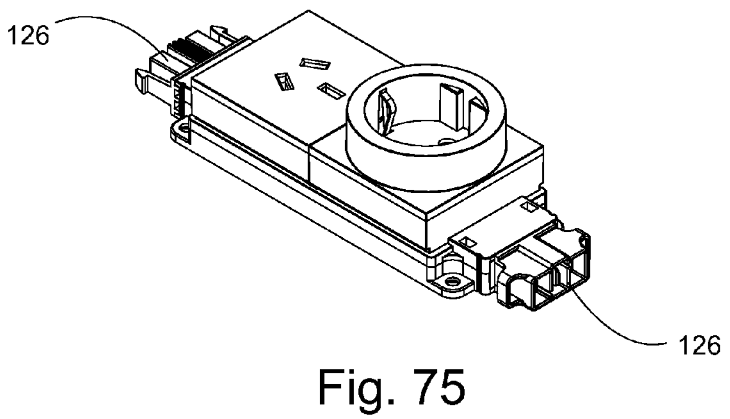
FIG. 75 is a perspective view similar to FIG. 74, but showing the junction block in use with the second receptacle as shown in FIGS. 21-26 and the first receptacle as shown in FIGS. 15-20.
Figure 76:
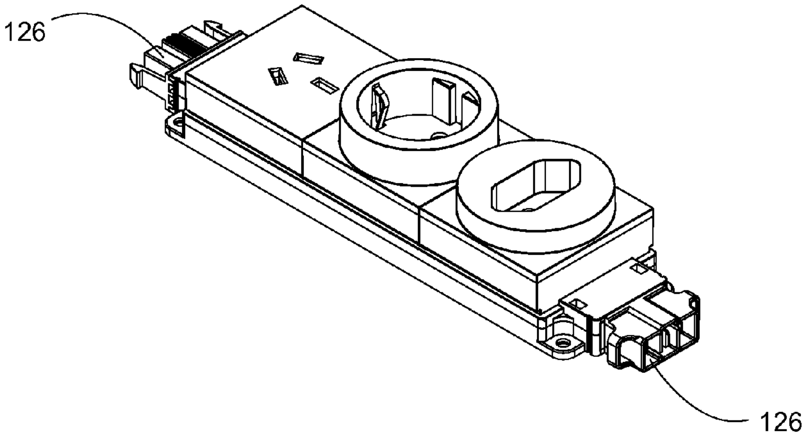
FIG. 76 is a perspective view of another embodiment of a junction block in accordance with the invention, showing the capability of receiving three receptacles, and specifically showing use with the second receptacle (FIGS. 21-26), first receptacle (FIGS. 15-20) and third receptacle (FIGS. 27-32)
Figure 77:
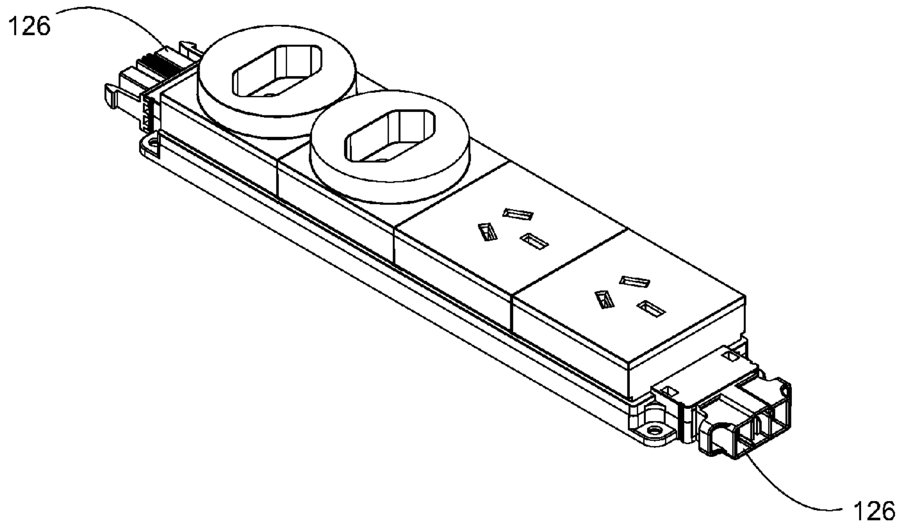
FIG. 77 is a perspective view of a further embodiment of a junction block in accordance with the invention, showing the junction block as being adapted to receive four receptacles, and expressly showing its use with two of the third receptacles (FIGS. 27-32) and two of the first receptacles (FIGS. 15-20)
Figure 78:
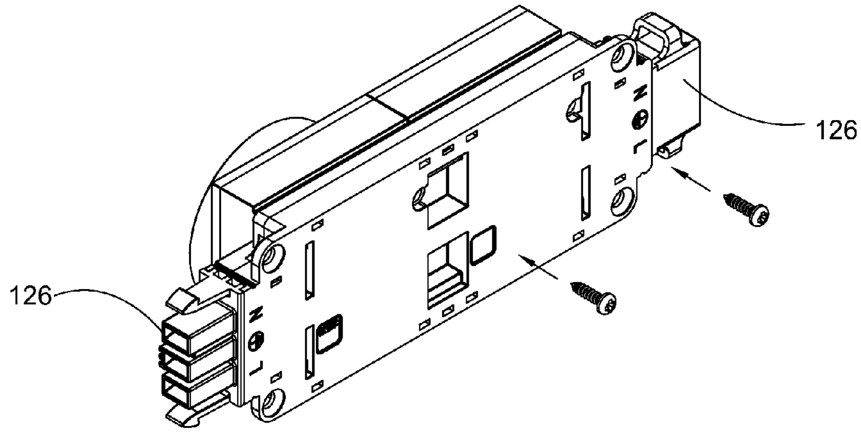
FIG. 78 illustrates a rear, perspective view of a junction block in accordance with the invention, and further showing it in an exploded view with connecting screws positioned so as to connect a rear plate to the junction block.
Figure 79:
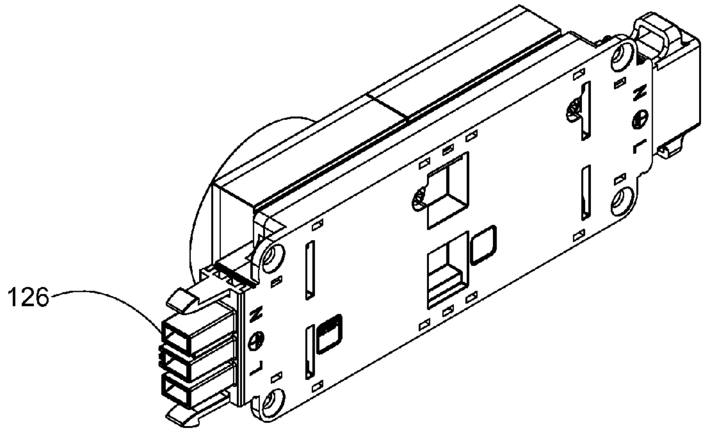
FIG. 79 shows the junction block of FIG. 78 in a fully assembled position.
Figure 80:
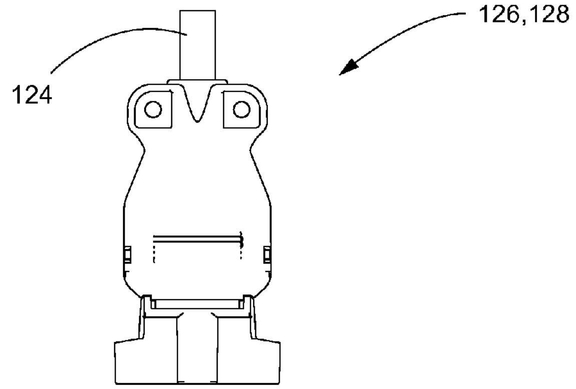
FIG. 80 is a rear, elevation view of a cable connector in accordance with the invention.
Figure 81:
FIG. 81 is a plan view of the cable connector shown in FIG. 80.
Figure 82:
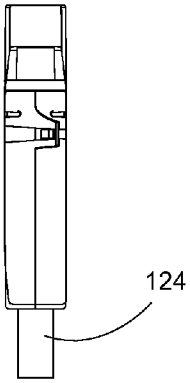
FIG. 82 is a left-side end view of the cable connector shown in FIG. 80.
Figure 83:
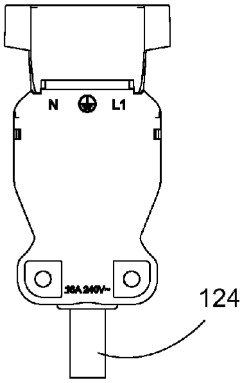
FIG. 83 is a front, elevation view of the cable connector shown in FIG. 80.
Figure 84:
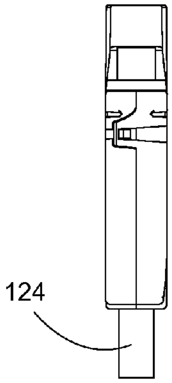
FIG. 84 is a right-side end view of the cable connector shown in FIG. 80.
Figure 85:
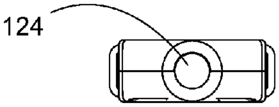
FIG. 85 is an underside view of the cable connector shown in FIG. 80.
Figure 86:
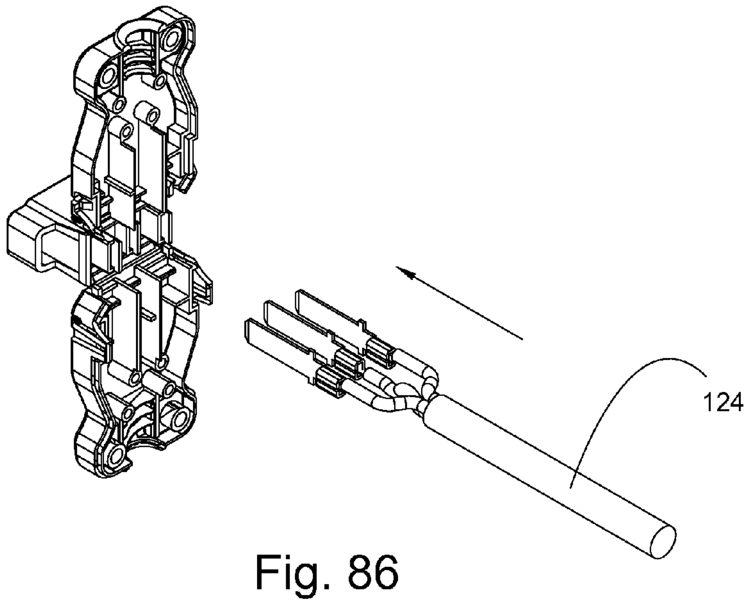
FIG. 86 is an exploded view of the cable connector shown in FIG. 80-85, and showing the position of the cable and blade terminals as they are received within the housing of the cable connector.
Figure 87:
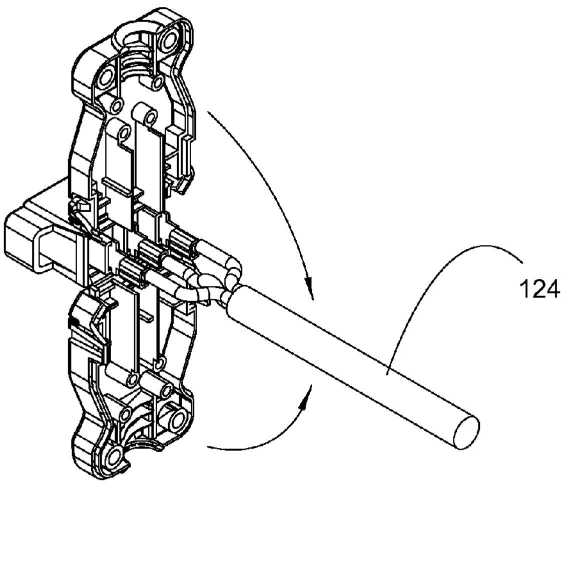
FIG. 87 is a view similar to FIG. 86, but shows the cable and terminal blades connected to the housing of the cable connector.
Figure 88:
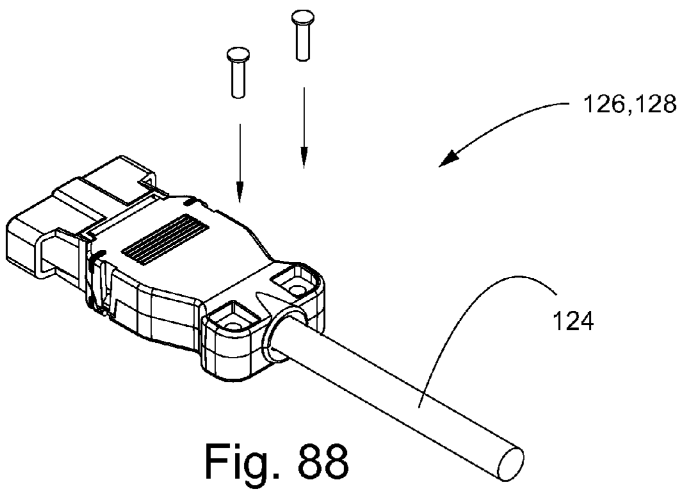
FIG. 88 is a perspective, exploded view of the cable connector shown in FIGS. 80-85, and expressly showing the position of the screws or pop rivets as are utilized to assemble together the sides of the cable connector housing.
Figure 89:
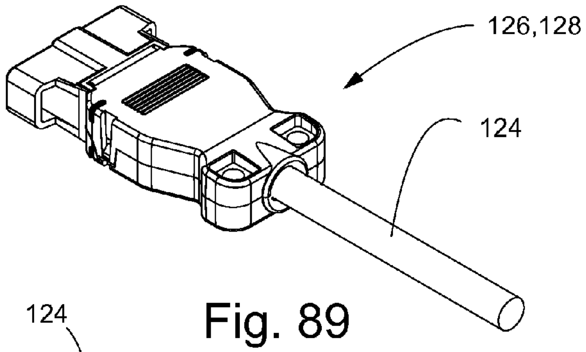
FIG. 89 is a right-side perspective view of the fully assembled cable connector as shown in FIG. 88.
Figure 90:
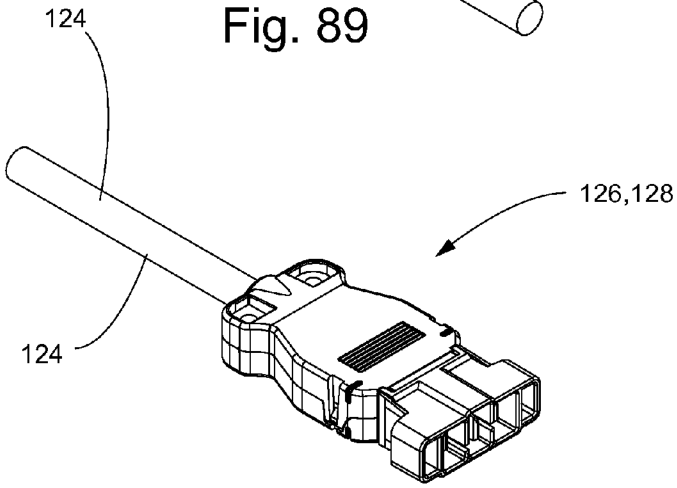
FIG. 90 is an underside, perspective view of the cable connector as shown in FIG. 89.
Figure 91:
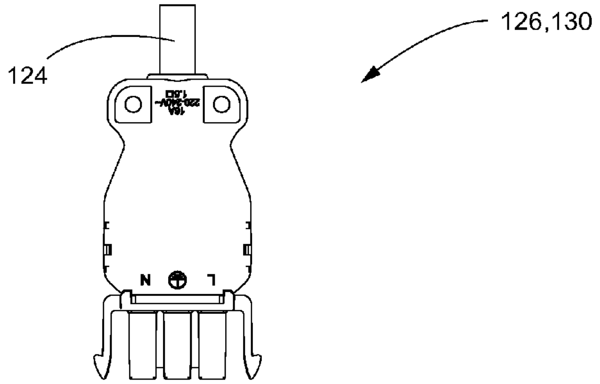
FIG. 91 is a rear, perspective view of a female cable connector in accordance with the invention.
Figure 92:
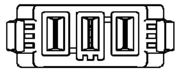
FIG. 92 is a plan view of the cable connector as shown in FIG. 91.
Figure 93:
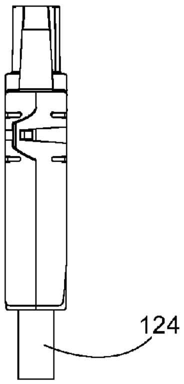
FIG. 93 is a left-side end view of the cable connector as shown in FIG. 91.
Figure 94:
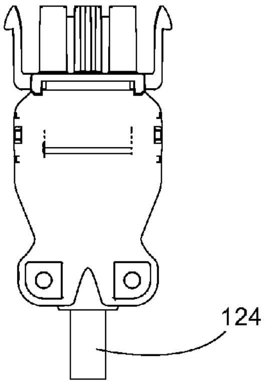
FIG. 94 is a front, elevation view of the female cable connector as shown in FIG. 91.
Figure 95:
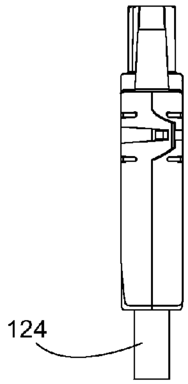
FIG. 95 is a right-side end view of the female cable connector as shown in FIG. 91.
Figure 96:
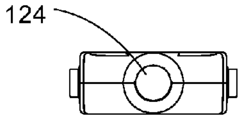
FIG. 96 is an underside view in section of the cable connector as shown in FIG. 91.
Figure 97:
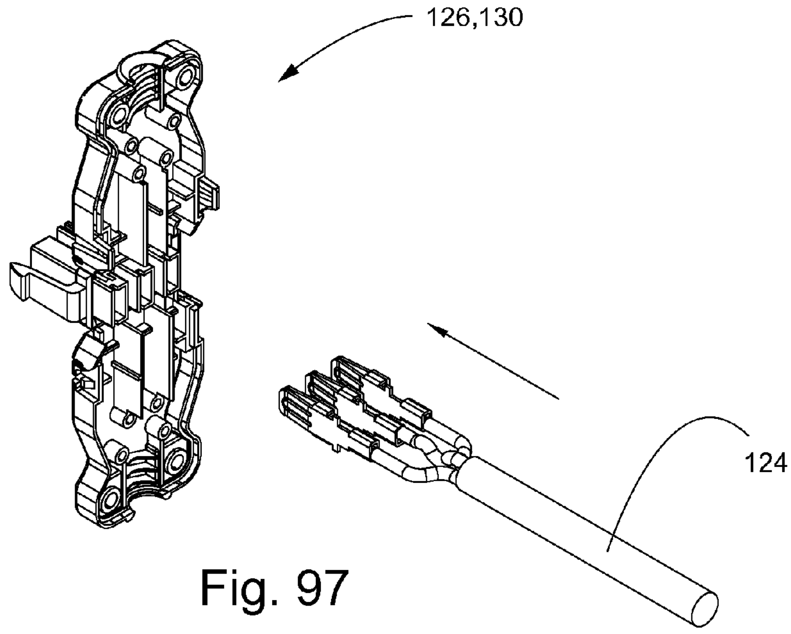
FIG. 97 is a perspective and exploded view of the female cable connector as shown in FIG. 91, and showing the cable and female terminal blades as they are received within the housing of the cable connector.
Figure 98:
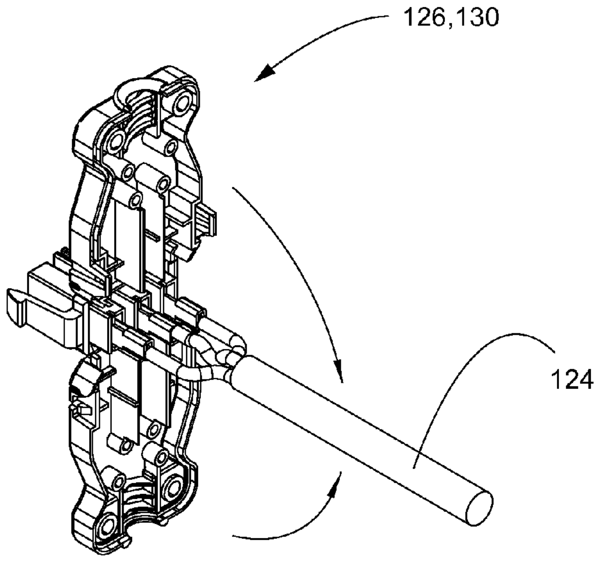
FIG. 98 shows the cable and female terminals as they are received within the cable connector housing.
Figure 99:
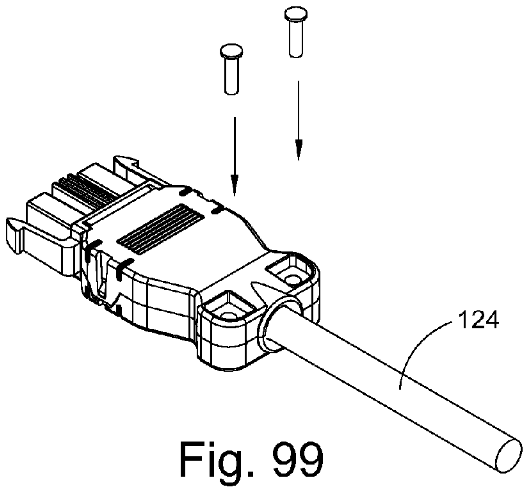
FIG. 99 is a perspective view of the female cable connector as shown in FIG. 91, and showing the two halves of the housing being connected together through screws or pop rivets.
Figure 100:
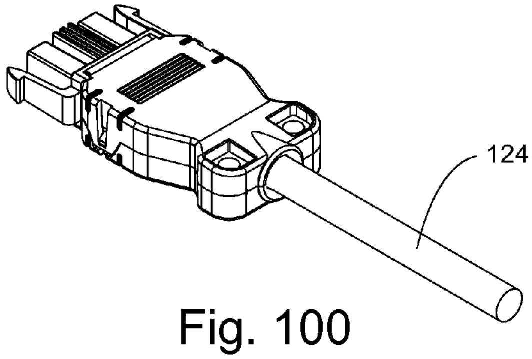
FIG. 100 is a front, perspective view of the fully assembled female cable connector as shown in FIG. 99.
Figure 101:
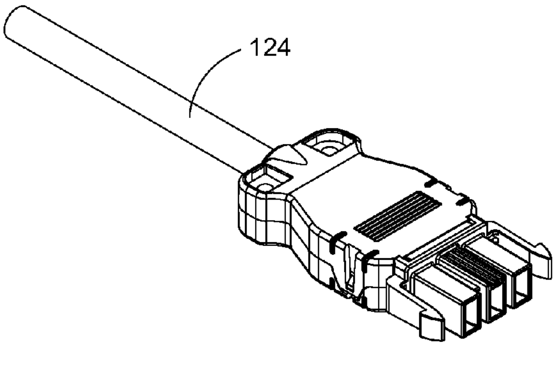
FIG. 101 is an underside, perspective view of the female cable connector as shown in FIG. 100.
Figure 102:
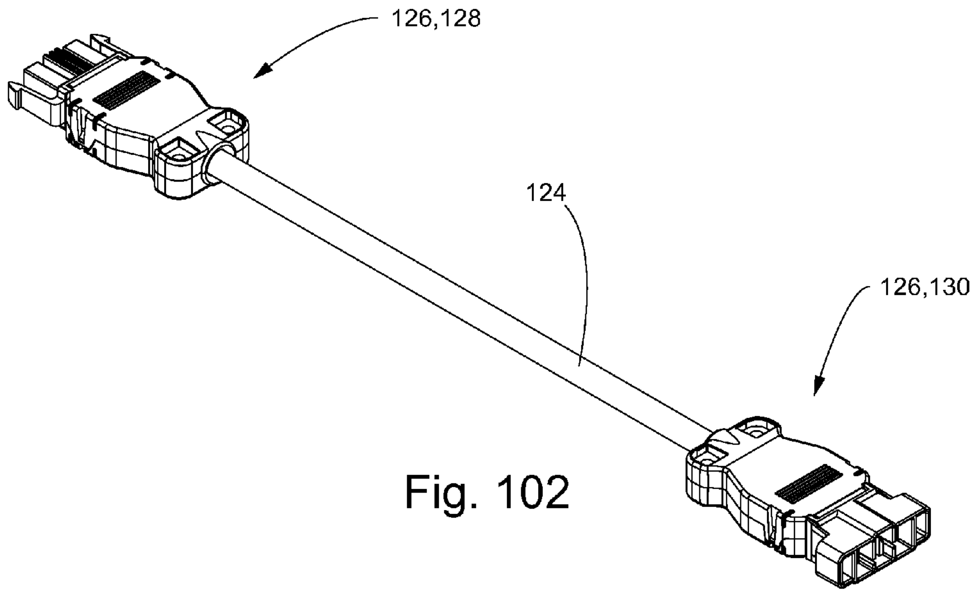
FIG. 102 is a perspective view of a full connector cable with male and female ends in accordance with the invention.
Figure 103:
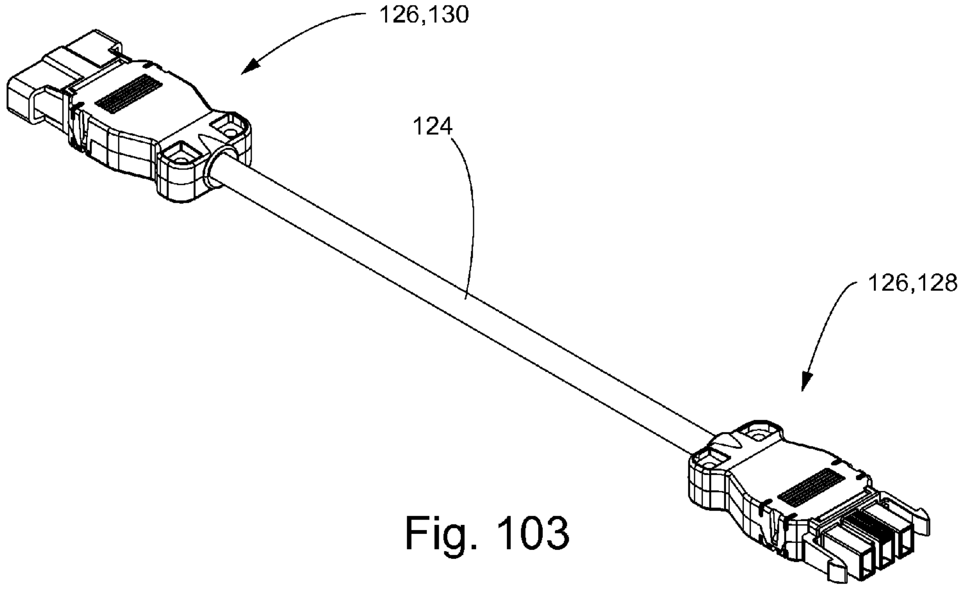
FIG. 103 is a perspective view similar to FIG. 102, but in an opposing configuration, showing the connector cable in accordance with the invention.
Figure 104:
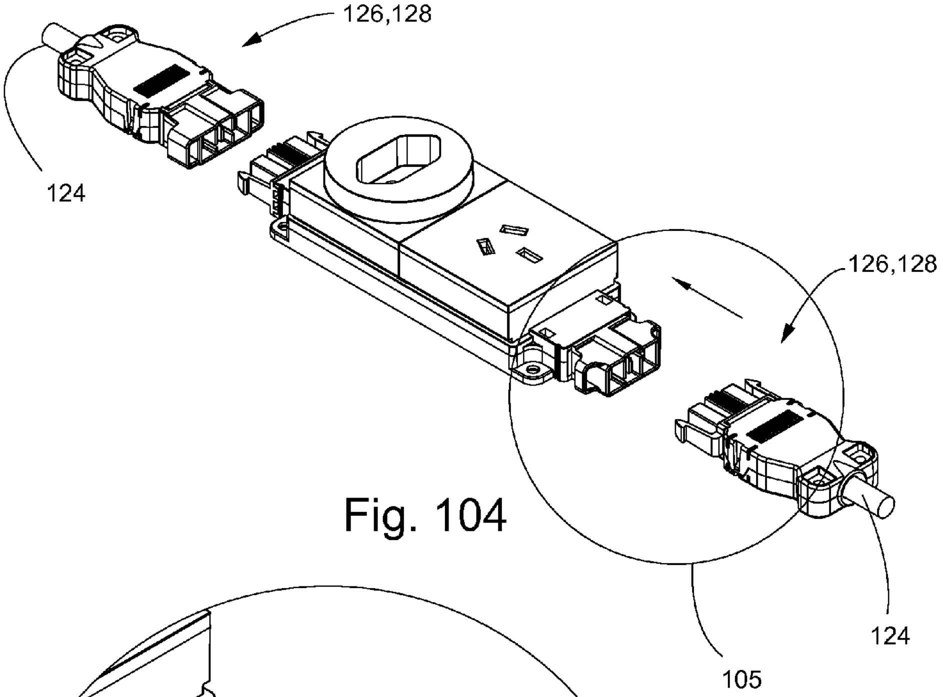
FIG. 104 is a perspective view of a junction block in accordance with the invention, having two receptacles and showing the junction block in an exploded format with cable connector ends positioned so as to be received by junction block end connectors.
Figure 105:
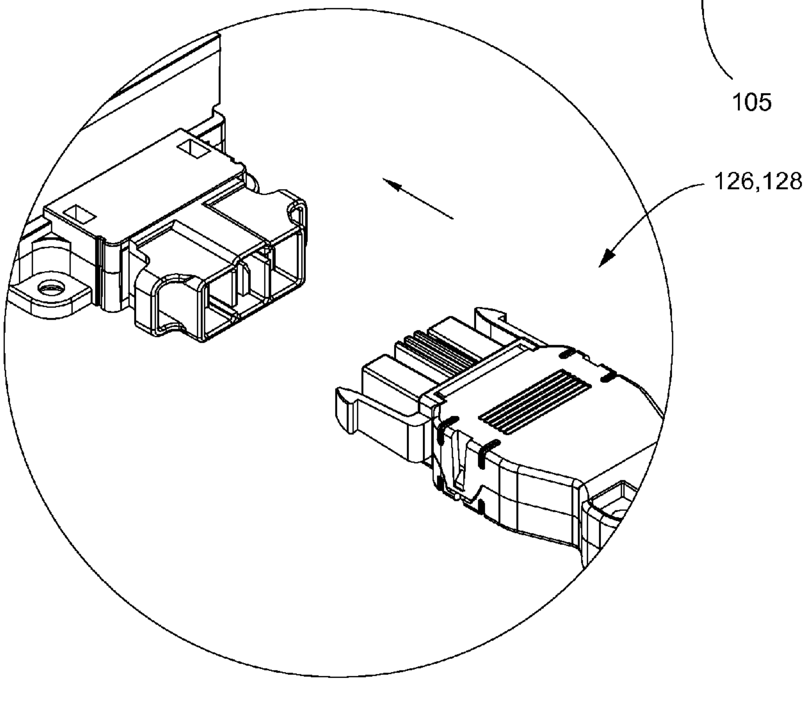
FIG. 105 is an exploded view of the portion of FIG. 104 identified within circle 105.
Figure 106:
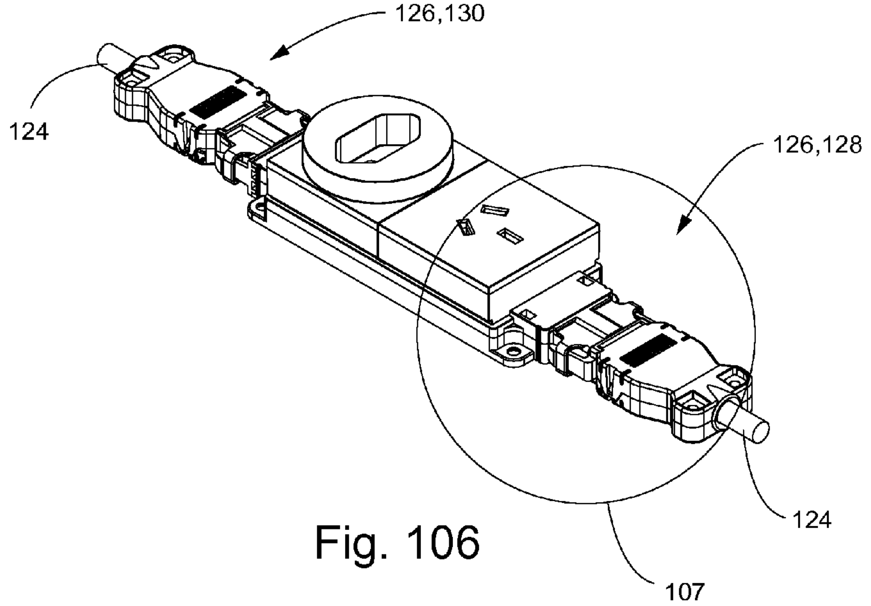
FIG. 106 is a perspective view similar to FIG. 104, but showing the junction block in a fully assembled position with respect to the connector cable ends.
Figure 107:
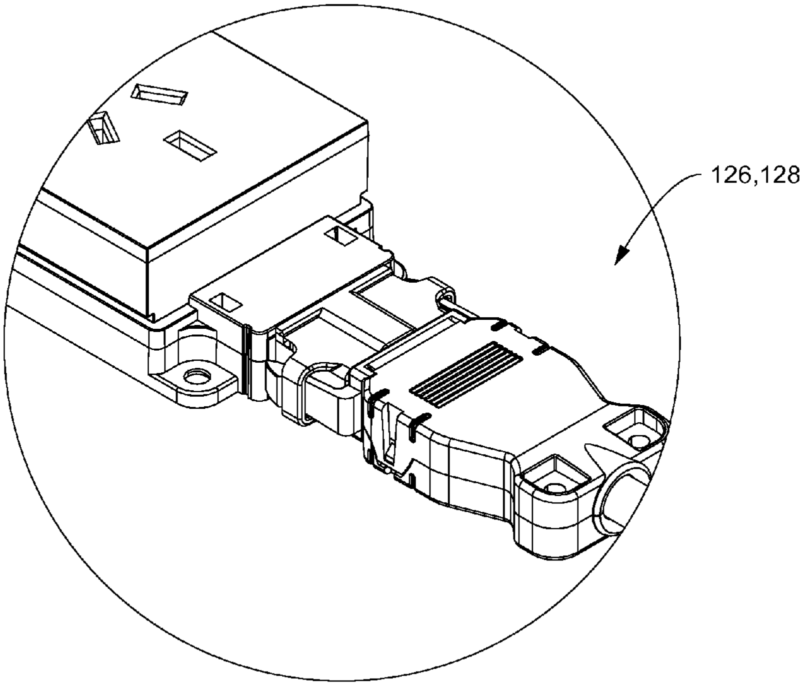
FIG. 107 is an exploded view of the portion of FIG. 106 identified by circle 107.
Figure 108:
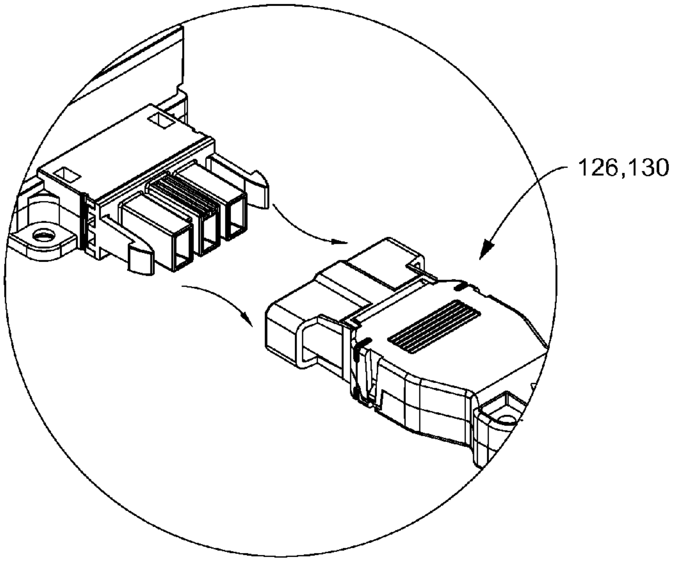
FIG. 108 is an enlarged view showing the positioning of a junction block connector as it is about to receive a cable connector end.
Figure 109:
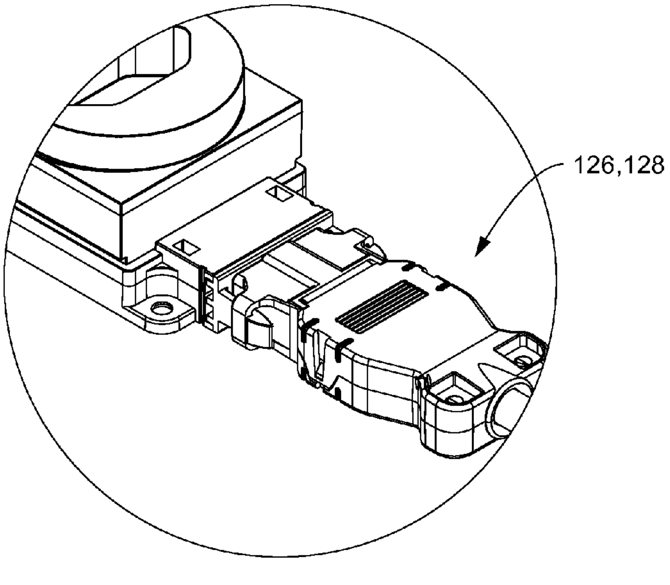
FIG. 109 is a view similar to FIG. 108, but showing the junction block connector and the connector cable end in a fully assembled position.
Figure 110:
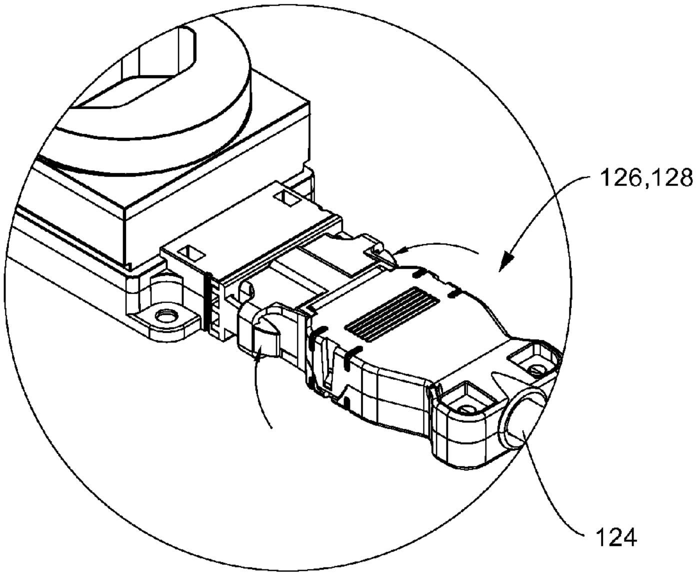
FIG. 110 is a perspective view similar to FIG. 109.
Figure 111:
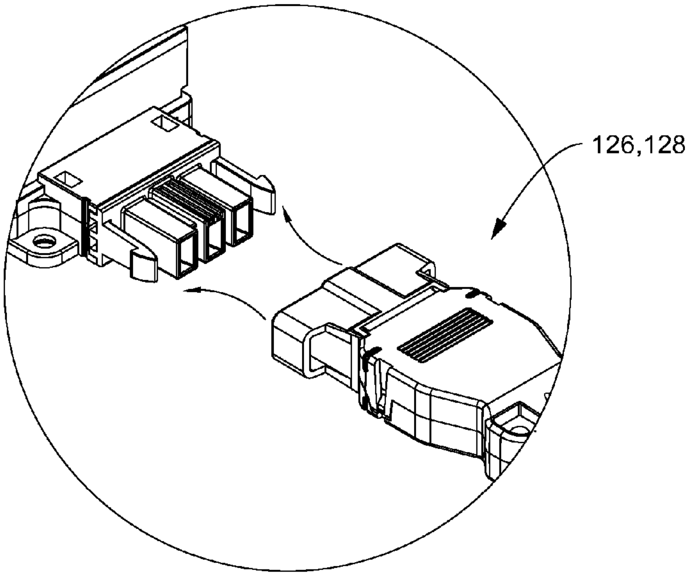
FIG. 111 is a perspective view similar to FIG. 108.
Figure 112:
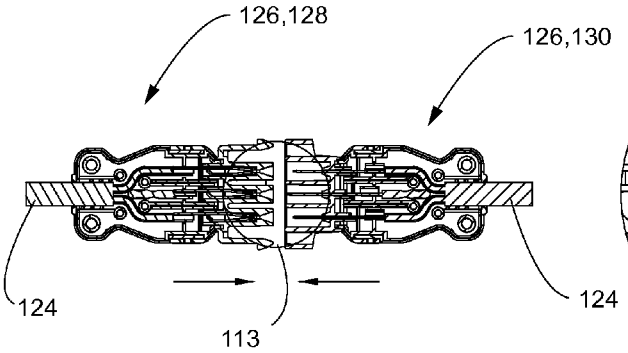
FIG. 112 is a sectional view showing an exploded view of a male cable connector end being received by a female cable connector end of another connector cable.
Figure 113:
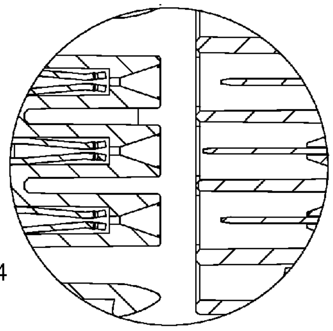
FIG. 113 is an exploded view of a portion of FIG. 112, identified by the circle 113.
Figure 114:
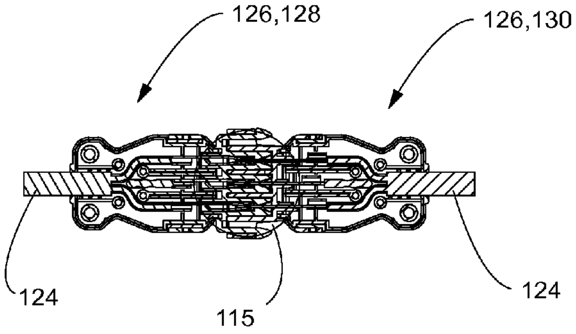
Figure 115:
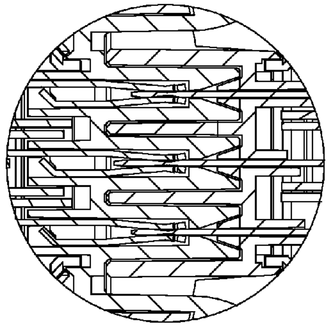
Figure 116:
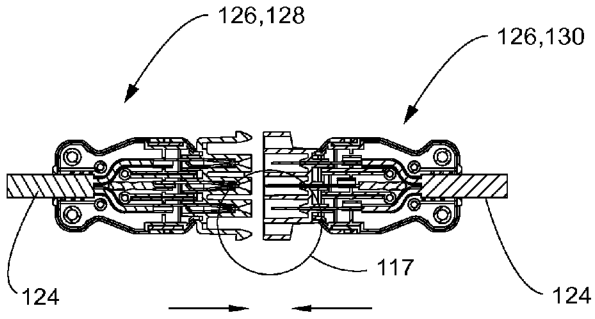
Figure 117:
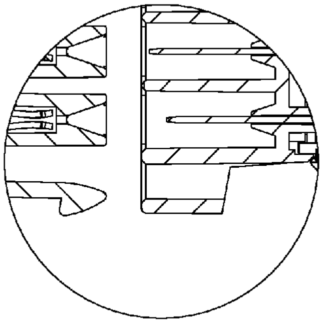
Figure 118:
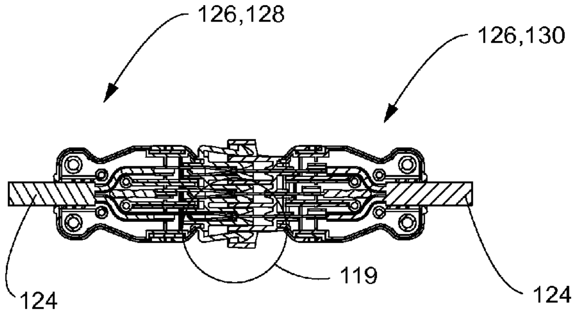
Figure 119:
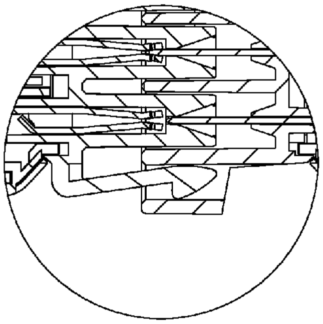
Figure 120:
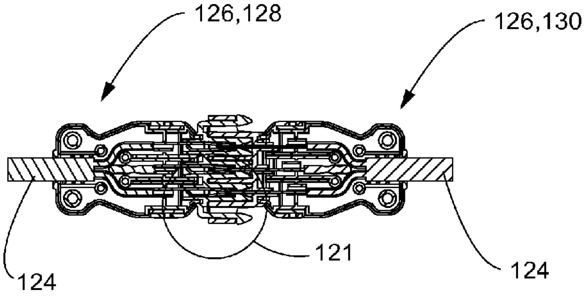
Figure 121:
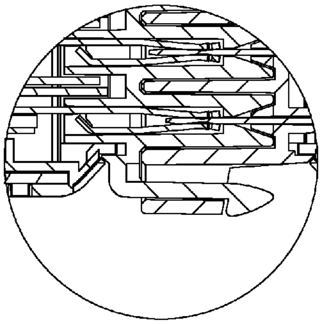

A further international outlet system in accordance with the invention is described herein as wall panel outlet system 140 as illustrated in FIGS. 3 and 4. The wall panel international outlet system 140 is adapted for use with furniture such as the wall panels 142 and 144 illustrated in FIG. 3. Although not shown in FIGS. 3 and 4, the various components of the wall panel outlet system 140 can be received within raceways or the like (not shown) associated with the interiors of the wall panels 142, 144. In the particular configuration shown in FIGS. 3 and 4, the system 140 includes an incoming power entry connector 106, with a single power entry cable 108. The power entry cable 108 includes a power entry cable connector 110 and an opposing power entry cable connector 112. As further shown in FIG. 3, the system 140 includes a set of five junction blocks 114. Also included are a set of four connector cable assemblies 116, with the connector cable assemblies 116 being capable of being of differing lengths. In addition, the power entry cable 108 can also be configured in a manner substantially identical to any of the connector cable assemblies 116. One element which is illustrated in FIG. 3, but was not shown in FIG. 1 or 2 is the connector terminal assembly 146. As shown in FIG. 3, and in an enlarged view in FIG. 4, the connector terminal assembly 146 provides for the capability of receiving two connector cable end connectors, and connecting both to a junction block end connector 126. Again, this is particularly shown in FIG. 4.

It will be apparent to those skilled in the pertinent arts that still other embodiments of electrical assemblies in accordance with the invention can be designed. That is the principles of an electrical assembly in accordance with the invention are not limited to the specific embodiments described herein. Accordingly, it will be apparent to those skilled in the art that modifications and other variations of the above-described illustrative embodiments of the invention may be effected without departing from the spirit and scope of the novel concepts of the invention.

The invention claimed is:

1. An international power distribution system for energizing different types of outlet receptacles, said power distribution system comprising:

an incoming power cable assembly connected to a source of incoming power;

a plurality of junction block assemblies, with at least a first one of said junction block assemblies electrically coupled to the source of incoming power;

a plurality of cable assemblies electrically and mechanically interconnecting said junction block assemblies;

said junction block assemblies comprising respective receptacle receiving portions configured to mechanically support, and to electrically energize from the source of incoming power, a plurality of differing international outlet receptacles having differing types of outlet sockets, without requiring any electrical or mechanical modifications to said junction block assemblies; and a plurality of electrical bus bars in spaced arrangement and extending through said receptacle-receiving portions of said junction block assemblies, wherein each of said electrical bus bars is configured to be electrically and slidably engaged by a respective electrical contact that is disposed along a rear portion of each of the outlet receptacles.

2. The international power distribution system of claim 1, wherein said outlet receptacles comprise at least one chosen from a Type F outlet receptacle and a Schuko outlet receptacle.

3. The international power distribution system of claim 1, wherein said outlet receptacles comprise a Type I receptacle having a ground pin and a pair of live pins forming a V-shape.

4. The international power distribution system of claim 1, wherein said outlet receptacles comprise a Type J receptacle.

5. The international power distribution system of claim 1, wherein said outlet receptacles comprise a Type B NEMA 5 receptacle.

6. The international power distribution system of claim 1, wherein said outlet receptacles comprise a Type B receptacle.

7. The international power distribution system of claim 1, wherein said outlet receptacles comprise at least one of a Type G receptacle and a 13 amp receptacle.

8. The international power distribution system of claim 1, wherein said junction block assemblies each comprise a junction block and a pair of junction block end connectors located at opposing ends of said junction block, and wherein said receptacle receiving portions are located within said junction blocks.

9. The international power distribution system of claim 1, wherein:
- each of said junction block assemblies of said plurality of junction block assemblies comprises at least one junction block; and
- said receptacle receiving portions each comprise a pair of receiving sections located in a face of said junction block, said receiving portions configured for receiving a pair of said outlet receptacles.

10. The international power distribution system of claim 9, wherein a first receptacle of said pair of said outlet receptacles is a different type and configuration than a second receptacle of said pair of outlet receptacles.

11. The international power distribution system of claim 1, wherein:
- each of said junction block assemblies comprises a junction block; and
- said receptacle receiving portions comprise, for each of said junction blocks, a set of three receiving sections located in a face of said junction block, for receiving three of said outlet receptacles.

12. The international power distribution system of claim 11, wherein each of said three outlet receptacles can be of a different type and configuration from the other two of said three outlet receptacles.

13. The international power distribution system of claim 1, wherein:
- each of said junction block assemblies comprises a junction block; and
- wherein said receptacle receiving portions comprise a set of four receiving sections located in a face of said junction block, said receiving sections configured for receiving four of said outlet receptacles, with each of said outlet receptacles being of a differing type and configuration from the other three of said outlet receptacles.

14. The international power distribution system of claim 1, wherein at least a subset of said cable assemblies comprise jumper cable assemblies, with each of said jumper cable assemblies having a cable connected at its ends to a pair of opposing end connectors.

15. The international power distribution system of claim 1, wherein at least a subset of said plurality of junction block assemblies each comprise a junction block and a pair of opposing end connectors.

16. The international power distribution system of claim 1, wherein at least a subset of said outlet receptacles are polarized.

17. The international power distribution system of claim 1, wherein said incoming power cable assembly corresponds in structure and configuration to at least a subset of said plurality of said cable assemblies.

18. The international power distribution system of claim 1, wherein:
- at least a subset of said plurality of junction block assemblies each comprise a junction block and a pair of junction block end connectors; and
- said power distribution system further comprises a connector terminal assembly for electrically and mechanically interconnecting a pair of cable assemblies with one of said end connectors of one of said subset of said junction block assemblies.

19. The international power distribution system of claim 18, wherein said connector terminal assembly comprises a quad connector.

20. The international power distribution system of claim 1, wherein:
- at least a subset of said junction block assemblies each comprise a junction block; and
- said power distribution system further comprises a coupler for attaching each of said junction blocks of said subset of said junction block assemblies to a vertically disposed wall element.

21. An electrical power distribution system for energizing different types of outlet receptacles, said power distribution system comprising:
- an incoming power cable assembly connected to a source of incoming power;
- a junction block assembly electrically coupled to the source of incoming power via said incoming power cable assembly, said junction block assembly comprising a receptacle-receiving portion;
- at least one outlet receptacle having an outlet socket and configured for mechanical and electrical engagement with said receptacle-receiving portion of said junction block assembly; and
- wherein said receptacle-receiving portion of said junction block assembly is configured to mechanically support and electrically energize, without electrical or mechanical modification to said receptacle-receiving portion, a plurality of different ones of said outlet receptacles having different outlet receptacle configurations; and
- a plurality of electrical bus bars coupled to said junction block assembly in spaced arrangement and extending through said receptacle-receiving portion thereof, wherein each of said electrical bus bars is configured to be engaged by a respective electrical contact disposed along a rear portion of said outlet receptacle upon coupling of said outlet receptacle to said junction block assembly at said receptacle-receiving portion.

22. The electrical power distribution system of claim 21, wherein said receptacle-receiving portion of said junction block assembly is configured to mechanically support and electrically energize any of said outlet receptacles chosen from (i) a Type B receptacle, (ii) a Type B NEMA 5 receptacle, (iii) a Type F outlet receptacle, (iv) a Type G receptacle, (v) a Type I receptacle, (vi) a Type J receptacle, (vii) a Schuko outlet receptacle, and (viii) a 13 amp receptacle.

23. The electrical power distribution system of claim 21, wherein said receptacle-receiving portion of said junction block assembly is configured to mechanically support and electrically energize at least two of said outlet receptacles simultaneously.

24. The electrical power distribution system of claim 23, wherein said at least two outlet receptacles comprise different types of outlet receptacles.

25. The electrical power distribution system of claim 21, wherein said junction block assembly comprises a junction block and a pair of junction block end connectors located at opposing ends of said junction block, and wherein said receptacle-receiving portions are located within said junction blocks.

26. The electrical power distribution system of claim 23, wherein said electrical bus bars are configured to provide electrical continuity across said junction block assembly when said junction block assembly is not supporting the outlet receptacle.

27. The electrical power distribution system of claim 26, wherein said electrical bus bars are substantially parallel to one another and are arranged longitudinally in said receptacle-receiving portion of said junction block assembly.

28. The electrical power distribution system of claim 27, wherein said junction block assembly comprises a pair of opposing end connectors, each of said end connectors comprising a hot terminal, a neutral terminal, and a ground terminal that is electrically coupled to a respective one of said electrical bus bars.

29. The international power distribution system of claim 1, wherein said electrical bus bars are configured to provide electrical continuity across said junction block assemblies when said junction block assemblies are not supporting the international outlet receptacles.

30. The international power distribution system of claim 29, wherein said electrical bus bars are substantially parallel to one another and are arranged longitudinally in said receptacle-receiving portion of said junction block assembly.

31. The international power distribution system of claim 30, wherein said junction block assemblies comprise a pair of opposing end connectors, each of said end connectors comprising a hot terminal, a neutral terminal, and a ground terminal that is electrically coupled to a respective one of said electrical bus bars.

32. The international power distribution system of claim 1, wherein at least one of said electrical bus bars is configured to be engaged at different locations by the electrical contacts of different ones of the international outlet receptacles.

33. The international power distribution system of claim 21, wherein at least one of said electrical bus bars is configured to be engaged at different locations by said electrical contacts of different ones of a plurality of said outlet receptacles.

* * * * *